(12) United States Patent
Masuda

(10) Patent No.: US 7,944,256 B2
(45) Date of Patent: May 17, 2011

(54) SEMICONDUCTOR INTEGRATED CIRCUIT DEVICE

(75) Inventor: Noboru Masuda, Tokorozawa (JP)

(73) Assignee: Hitachi, Ltd., Tokyo (JP)

( * ) Notice: Subject to any disclaimer, the term of this patent is extended or adjusted under 35 U.S.C. 154(b) by 243 days.

(21) Appl. No.: 12/010,597

(22) Filed: Jan. 28, 2008

(65) Prior Publication Data

US 2008/0218217 A1    Sep. 11, 2008

(30) Foreign Application Priority Data

Mar. 7, 2007    (JP) .................................. 2007-057890

(51) Int. Cl.
*H03L 7/06* (2006.01)
(52) U.S. Cl. ........................................ 327/156; 327/147
(58) Field of Classification Search .................. 327/149, 327/156, 158
See application file for complete search history.

(56) References Cited

U.S. PATENT DOCUMENTS

| | | | | |
|---|---|---|---|---|
| 6,147,530 | A * | 11/2000 | Nogawa | 327/156 |
| 6,247,138 | B1 | 6/2001 | Tamura et al. | |
| 6,414,556 | B1 | 7/2002 | Mizuno | |
| 6,768,387 | B1 | 7/2004 | Masuda et al. | |
| 6,792,064 | B2 * | 9/2004 | Nakamura | 375/376 |
| 7,061,290 | B2 * | 6/2006 | Hasegawa | 327/157 |
| 7,061,330 | B2 * | 6/2006 | Kegasa et al. | 331/11 |
| 7,279,945 | B2 * | 10/2007 | Hou et al. | 327/156 |
| 7,369,000 | B2 * | 5/2008 | Wu et al. | 331/1 R |
| 7,372,339 | B2 * | 5/2008 | Fu | 331/16 |
| 7,439,816 | B1 * | 10/2008 | Lombaard | 331/16 |
| 7,656,236 | B2 * | 2/2010 | Williams | 331/16 |
| 2001/0015677 | A1 * | 8/2001 | Choi | 331/11 |
| 2007/0120612 | A1 * | 5/2007 | Fu | 331/34 |

(Continued)

FOREIGN PATENT DOCUMENTS

JP    60-111528    11/1983

(Continued)

OTHER PUBLICATIONS

An Office Action from Japanese Patent Office dated Dec. 16, 2008 regarding Japanese Patent Application No. 2007-057890.

*Primary Examiner* — Lincoln Donovan
*Assistant Examiner* — Adam D Houston
(74) *Attorney, Agent, or Firm* — Stites & Harbison PLLC; Juan Carlos A. Marquez, Esq.

(57) ABSTRACT

High precision of various feedback systems represented by a PLL circuit and the like is realized. For example, in a charge pump circuit in the PLL circuit, a first to a third PMOS transistors connected in series in three stages are provided between a power source voltage and an output node, and a first to a third NMOS transistors connected in series in three stages are provided between a ground voltage and the output node. And, the second PMOS transistor and the second NMOS transistor are driven ON when establishing conductivity between the power source voltage or the ground voltage and the output node by a first pulse signal, and the first PMOS transistor and the third NMOS transistor are driven OFF when the conductivity is shut down by a second pulse signal. Accordingly, the conduction time can be set by time difference between one edge of the first pulse signal and one edge of the second pulse signal, and therefore, short conduction time can be set, as a result, a charge amount of the charge pump circuit can be controlled precisely.

1 Claim, 20 Drawing Sheets

U.S. PATENT DOCUMENTS

2007/0177703 A1 8/2007 Senba
2007/0229129 A1* 10/2007 Nakagawa .................. 327/156

FOREIGN PATENT DOCUMENTS

| | | |
|---|---|---|
| JP | 62-048809 | 8/1985 |
| JP | 62-125709 | 11/1985 |
| JP | 01-161912 | 12/1987 |
| JP | 03-101410 | 9/1989 |
| JP | 7-106959 | 10/1993 |
| JP | 9-266443 | 3/1996 |
| JP | 09-148894 | 8/1996 |
| JP | 10-200382 | 1/1997 |
| JP | 11-122099 | 10/1997 |
| JP | 11-261408 | 5/1998 |
| JP | 2001-257567 | 3/2000 |
| JP | 2005-252723 | 3/2004 |

* cited by examiner

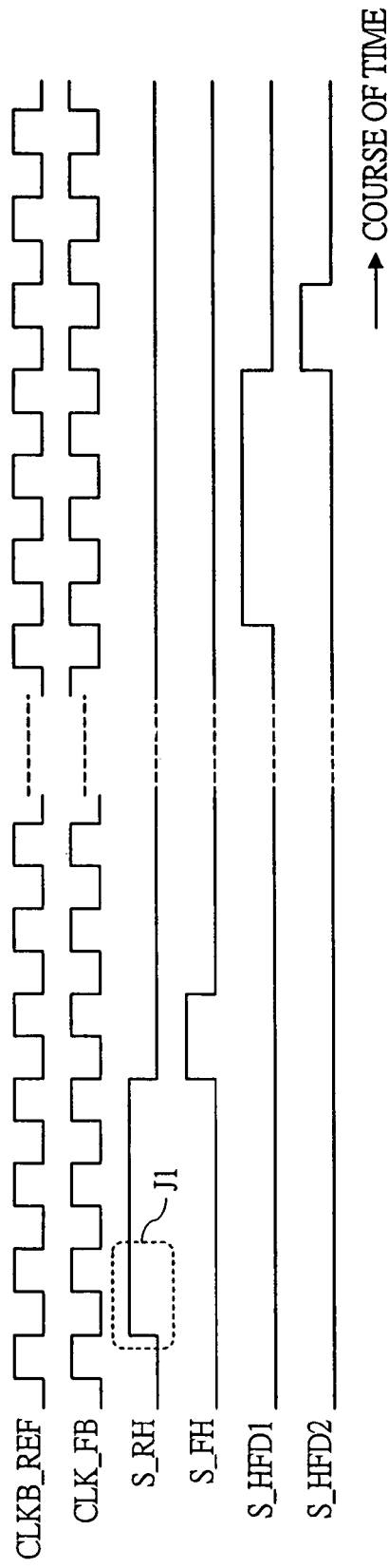
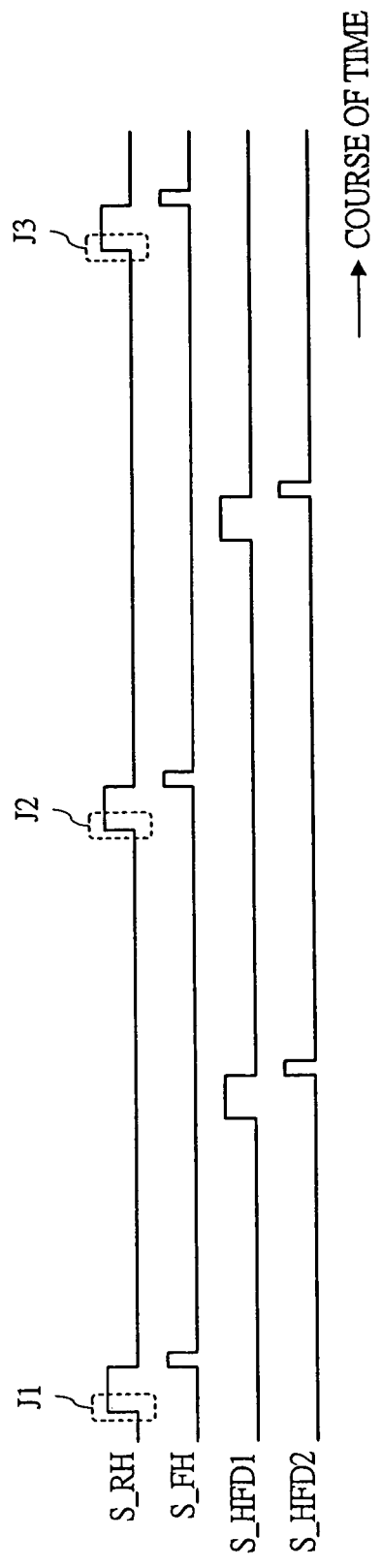

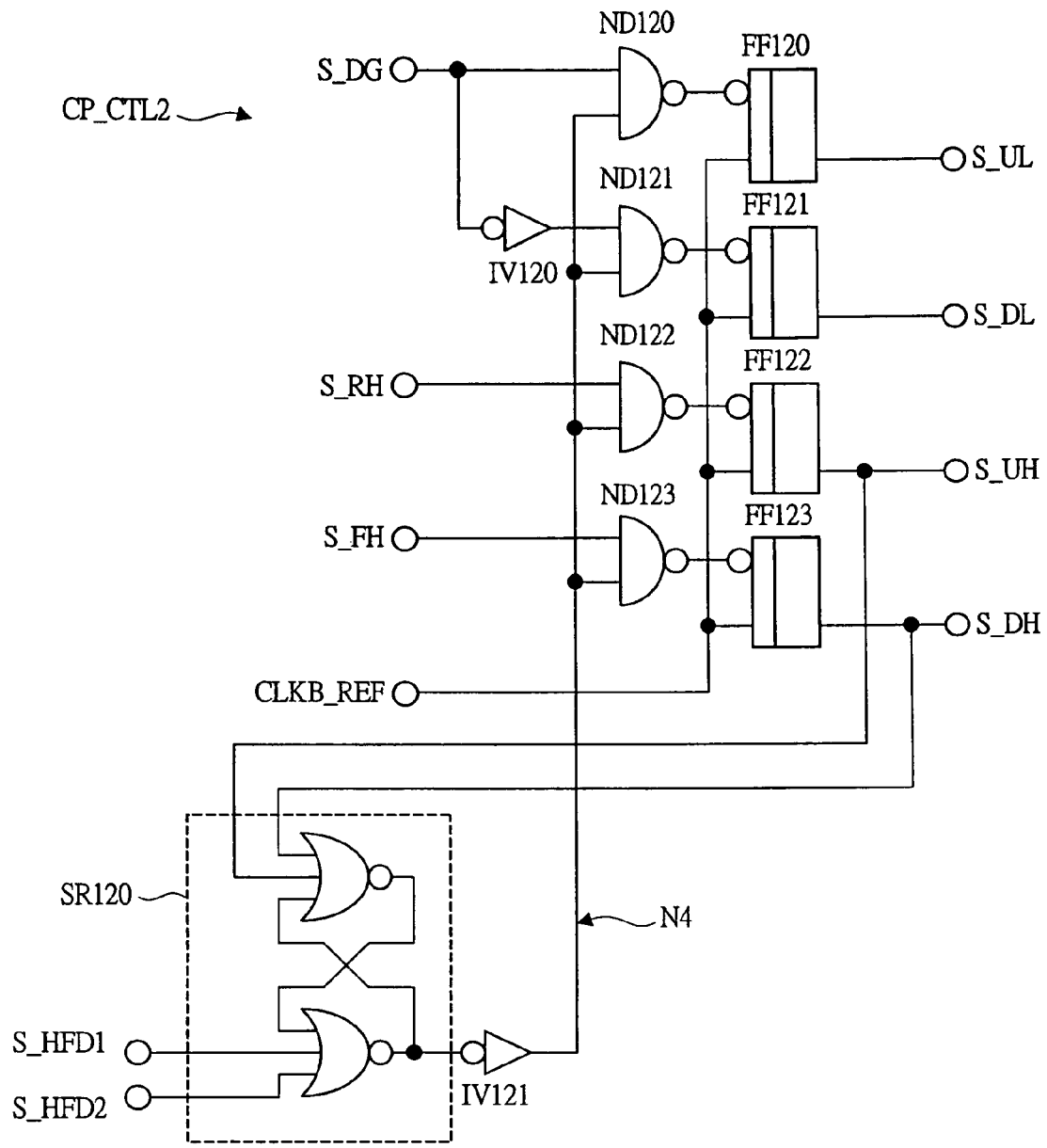

SEMICONDUCTOR INTEGRATED CIRCUIT DEVICE

CROSS-REFERENCE TO RELATED APPLICATION

The present application claims priority from Japanese Patent Application No. JP 2007-057890 filed on Mar. 7, 2007, the content of which is hereby incorporated by reference into this application.

TECHNICAL FIELD OF THE INVENTION

The present invention relates to a semiconductor integrated circuit device, in particularly, to technique effectively applied to a semiconductor integrated circuit device such as a PLL (Phase Locked Loop) circuit including a frequency comparison circuit and the like.

BACKGROUND OF THE INVENTION

For example, in Japanese Patent Application Laid-Open Publication No. 2001-257567 (Patent Document 1), a circuit configuration of a voltage controlled oscillator enabling generation of a clock signal having a small jitter even when a power source voltage fluctuates in a PLL circuit including a phase comparator, a frequency comparator, a voltage controlled oscillator and the like is disclosed. In concrete, to a circuit configuration in which a ring oscillator and capacitance mutually connected in parallel and a MOS transistor controlling an oscillation frequency by controlling a power source voltage (current) thereof are equipped, a second means of controlling the oscillation frequency according to a phase comparison result is provided. This second means is realized by capacitance whose connection/disconnection to the ring oscillator can be switched. When this capacitance is connected according the phase comparison result, the oscillation frequency is lowered with increase of a load, and when it is not connected, an opposite result is obtained.

Further, in Japanese Patent Application Laid-Open Publication No. 2005-252723 (Patent Document 2), a PLL circuit having a structure in which a comparison result of a frequency comparator is reflected to a VCO (Voltage Controlled Oscillator) through processings by an integration circuit, a comparator and a gain adjustment circuit is described. This frequency comparator performs comparison and judgment of high/low of frequencies by observing change of a phase of an inputted clock using three phase periods obtained from 3-phase clocks from the VCO as references. Such a result of the frequency comparator is reflected to the VCO through various processings as described above, and thereby even if erroneous detection occurs in the frequency comparator, influence thereof can be reduced.

Furthermore, in Japanese Patent Application Laid-Open Publication No. 60-111528 (Patent Document 3), an integrated circuit device in which delay time of a logic circuit is monitored using a ring oscillator formed on a same LSI, a power source voltage of the LSI is controlled so that an oscillation frequency of this ring oscillator has a predetermined value, and thereby the delay time of the logic circuit is stabilized is described. In these processings, the number of oscillation times of the ring oscillator is counted by a cycle of, for example, an external clock signal, a result of comparison of the counted value with a predetermined value is integrated, and a rate of an on-state of a transistor connected to a power supply route is controlled using the integrated value.

And, in Japanese Patent Application Laid-Open Publication No. 62-125709 (Patent Document 4), a semiconductor integrated circuit having an FET and comprising means to control fluctuation of a threshold voltage during operation of the FET is described. In concrete, for example, a dummy FET is provided in a chip, a feedback loop circuit keeping a threshold voltage of this dummy FET constant is configured and the threshold voltage of the dummy FET under the feedback control is supplied also to the regular FET.

SUMMARY OF THE INVENTION

For example, the PLL circuit shown in Patent Document 1 has a configuration in which the oscillation frequency of the voltage controlled oscillator is controlled by digital control and analog control. In the digital control, the switching of connection/disconnection of the capacitance as the second means described above is carried out based on a digital signal which is the phase comparison result. On the other hand, in the analog control, a gate voltage of a MOS transistor controlling the oscillation frequency described above is controlled in an analog manner by an output of a charge pump circuit, and charge and discharge of this charge pump circuit are controlled based on the phase comparison result and the frequency comparison result.

FIG. 2 is a circuit diagram showing a schematic configuration example of a voltage controlled oscillation circuit included in a PLL circuit examined as a premise of the present invention. The voltage controlled oscillation circuit VCO shown in FIG. 2 reflects characteristics of the voltage controlled oscillation circuit shown in Patent Document 1 and composed of a ring oscillator circuit OSC, capacitance C1 to C3, a NMOS transistor T1, PMOS transistors T2 and T3, a resistor R1 and the like. The OSC is provided between a power source voltage node Vdd and a second ground voltage node Vss2. The T1 is provided between the Vss2 and a first ground voltage node Vss, a supply voltage (supply current) to the OSC is controlled by a gate voltage thereof and an oscillation frequency of the OSC is controlled.

To the Vdd, the C3, the T2 and the T3 are connected in series in order, and an end of this T3 is connected to an inside node of the OSC. ON/OFF of the T2 is controlled by a digital control signal S_DG. When T2 is controlled to be ON, the C3 is added to the OSC. Accordingly, the oscillation frequency can be set to be relatively high by controlling the T2 to be OFF, and the oscillation frequency can be set to be relatively low by controlling the T2 to be ON. Note that, a gate of the T3 is connected to the Vss2, and usually kept at an ON state. This T3 is for preventing coupling noise associating with ON/OFF of the S_DG from directly affecting upon the inside node of the OSC, and can be omitted in some cases. Thus, by use of the digital control by the S_DG, phase jitter caused by sudden power-source noise and the like can be corrected quickly before fluctuation of an output phase becomes large.

On the other hand, to a gate of the T1, an analog control signal S_AG is applied via a low pass filter consisting of the R1 and the C2. As for the analog control by this S_AG, high speed property is not required by combination with the digital control described above. Accordingly, the S_AG can be connected via the low pass filter, and further, the C1 can be provided between the Vdd and the Vss2. Thereby, effect upon the oscillation frequency by fluctuation of the analog control voltage caused by sudden noise and current fluctuation of the T1 caused by thermal noise can be suppressed as much as possible.

Meanwhile, if the configuration of Patent Document 1 is employed, in a steady state, for example, the digital control signal S_DG shifts between an 'H' level and an 'L' level alternately in reflection of the phase comparison result, and along this, connection/disconnection of the capacitance C3 is switched alternately. In this state, frequency adjustment by the analog control is converged, and frequency fluctuation moving up and down around this converged frequency along with the digital control is added. As for the control width of a frequency along with the switching of the capacitance C3 in the digital control, for example, it is enough to secure size correcting high speed noise caused by thermal noise of the ring oscillator, however, the size of this control width becomes a jitter component in the steady state, and therefore, it is preferable that it is as small as possible.

On the other hand, control step of the frequency in the analog control is preferably set to 1/5 to 1/10 of the control width of the digital control, for example. Thereby, when a change equivalent to this control step occurs in the analog control, the control width of the digital control overlaps appropriately before and after this, and preferable frequency adjustment can be achieved. Therefore, as described above, in order to make the control width of the digital control small, it is also necessary to make the control step of the analog control small as much as that.

FIGS. 21A and 21B show an example of a charge pump circuit included in a PLL circuit examined as a premise of the present invention. FIG. 21A is a circuit diagram showing a schematic configuration example thereof and FIG. 21B is a waveform diagram showing an operation example of the circuit shown in FIG. 21A. A charge pump circuit CP_C shown in FIG. 21A schematically shows a charge pump circuit shown in FIG. 10 of Patent Document 1. In the configuration, PMOS transistors Tp210, Tp211 of series 2-stage connection and NMOS transistors Tn211, Tn210 of series 2-stage connection are connected in order between the power source voltage Vdd and the ground voltage Vss. To the Tp210 and the Tn210, bias voltages VP and VN are applied respectively and the Tp210 and Tn210 have a function to set a current value. Note that, in FIG. 10 of Patent Document 1, a resistor element is illustrated at an output portion, however, in the present application, this resistor is considered as a part of a VCO connected to a next stage and explained. A resistor R1 shown in FIG. 2 corresponds to this resistor.

To the Tp211, a result of calculation of an enable signal EN, a pulse signal PLS and an up signal UP inputted when increasing a frequency by an NAND circuit ND210 is inputted. In the same manner, to the Tn211, a result of calculation of the EN, the PLS and a down signal DOWN inputted when decreasing the frequency by an AND circuit AD210 is inputted. And, an output current (charge or discharge current) flowing via respective transistors according to UP or DOWN becomes the analog control signal S_AG in FIG. 2, integration is performed in the low pass filter consisting of the R1 and the C2, and then, the gate voltage of the T1 is controlled.

According to such a configuration, the control step of the frequency by the analog control mentioned above is determined by an integration amount of this outputted current. Therefore, in order to make this control step small, it is necessary to shorten time of flowing of the outputted current. The time of flowing of the outputted current is determined by pulse width of the pulse signal PLS, as shown in FIG. 21B. However, if the pulse width of the PLS is made too short, for example, a waveform of the node N1 to become an output of the AND circuit AD210 starts falling before it rises sufficiently and a high level of a waveform at the N1 may become insufficient. In this case, unevenness of a value of the outputted current and the time of flowing is increased as a result, and therefore, in the configuration of FIG. 21A, the time of flowing of the outputted current cannot make too short. Accordingly, technique for shortening the time and making adjustment of a charge amount with high accuracy possible is required.

And, in Patent Document 1, the control of the oscillation frequency is performed using a detection result of the frequency comparator, however, this frequency comparator may generate an erroneous detection under some conditions. FIG. 5 is a circuit diagram showing a configuration example of a frequency comparison circuit included in the PLL circuit examined as a premise of the present invention. A frequency comparison circuit FD in FIG. 5 has a configuration similar to that of a frequency comparator shown in FIG. 13 of Patent Document 1. This frequency comparison circuit FD is a circuit comparing an inverted reference signal CLKB_REF corresponding to a reference clock signal and a feedback signal CLK_FB corresponding to a feedback clock signal from the voltage controlled oscillator, and detecting which frequency is higher.

The CLKB_REF is connected to one input of an AND circuit AD50 via an inverter circuit IV50, and to the other input of the AD50, a signal obtained by passing an output of the IV50 through a delay circuit IV_DLY50 consisting of inverter circuits of odd number stages is inputted. In the same manner, the CLK_FB is connected to one input of an AND circuit AD51 via an inverter circuit IV51, and to the other input of the AD51, a signal obtained by passing an output of the IV51 through a delay circuit IV_DLY51 consisting of inverter circuits of odd number stages is inputted. Here, an output node of the AD50 is defined as A1 and an output node of the AD51 is defined as A2.

A set reset latch circuit SR50 is composed of two NOR circuits NR50, NR51 and two inverter circuits IV52, IV53 inverting outputs of the respective NOR circuits. One input node of the NR50 is connected to the A1 and the other input node is connected to an output node of the NR51. One input node of the NR51 is connected to the A2 and the other input node is connected to an output node of the NR50. If a node connected from the output node of the NR50 via the IV52 is defined as B1 and a node connected from the output node of the NR51 via the IV53 is defined as B2, the B1 is inputted to a flip-flop circuit FF50 and the B2 is inputted to a flip-flop circuit FF51. And, the FF50 operates using a signal of the A1 as a clock trigger and the FF51 operates using a signal of the A2 as a clock trigger.

The frequency comparison circuit FD in FIG. 5 compares an edge of the CLK_REF and an edge of the CLK_FB, detects a case in which during an edge of one signal appears twice sequentially, an edge of the other signal appears twice or more, and thus, judges that the other signal has a higher frequency. Note that, the edges used as the comparison objectives in two signals can be rising edges of both signals, falling edges of both signals (that is, the same edges) or a rising edge of one signal and a falling edge of the other signal. In the example in FIG. 5, the falling edges of the CLKB_REF and the CLK_FB are used as the comparison objectives. This frequency comparison circuit FD has many advantages such as small circuit scale, capability of detecting small difference of frequencies, and capability of detecting in short time in a case of large difference of frequencies in comparison with the circuit system shown in Patent Document 2, for example. FIG. 6 is an explanatory diagram showing an example of operation of the frequency comparison circuit FD in FIG. 5.

In FIG. 6, pulse signals R1 to R8 appearing in the A1 are 'H' pulse signals generated from the falling edge of the CLKB_REF when the CLKB_REF is inputted, and having pulse width corresponding to a delay amount of the IV_DLY50. In the same manner, pulse signals F1 to F8 appearing in the A2 are 'H' pulse signals generated from the falling edge of the CLK_FB when the CLK_FB is inputted, and having pulse width corresponding to a delay amount of the IV_DLY51. Here, an example in which a frequency of the CLKB_REF is slightly higher than that of the CLK_FB is shown.

For example, at a time point when the R2 appears after the F2, the R1 appears after the F1 also in the previous cycle. Since the set reset latch circuit SR50 memorizes which pulse of the A1 and the A2 disappears last, at a time point when the F2 appears, the set reset latch circuit SR50 outputs 'H'/'L' to B1/B2 along with the R1 that disappears last in the previous cycle. And, this 'L' level of the B2 is taken into the FF51 in synchronization with the F2 and an 'L' level is outputted to a frequency comparison signal S_FH to be an output of the FF51. And, when this F2 appears, a latch state of the SR50 is inverted, and 'L'/'H' is outputted to B1/B2. Thereafter, when the R2 appears, this 'L' level of the B1 is taken into the FF50 in synchronization with the R2, and an 'L' level is outputted also to a frequency comparison signal S_RH to be an output of the FF50. Thus, in a case where pulses appear in the A1 and the A2 alternately, the frequencies are regarded to be equal, and an 'L' level is outputted to both the S_RH and the S_FH.

On the other hand, for example, at a time point when the R5 appears before the F5, the R4 appears after the F4 in the previous cycle. Accordingly, at the time point when the R5 appears, the SR50 outputs 'H'/'L' to B1/B2 along with the R4 that disappears last in the previous cycle. And, this 'H' level of the B1 is taken into the FF50 in synchronization with the R5, and an 'H' level is outputted to the S_FH. And, even if this R5 appears, the latch state of the SR50 does not change, and 'H'/'L' is kept at B1/B2. Thereafter, when the F5 appears, this 'L' level of the B2 is taken into the FF51 in synchronization with the F5, and an 'L' level is outputted to the S_FH. Thus, when the pulses appear successively in the A1, the frequency of the A1 (that is, the CLKB_REF) is regarded to be higher, and an 'H' level is outputted to the S_RH and an 'L' level is outputted to the S_FH. Note that, when the pulses appear successively in the A2, the same operation is performed, the frequency of the CLK_FB is regarded to be higher, and an 'L' level is outputted to the S_RH, and an 'H' level is outputted to the S_FH.

However, as shown in the time points R3 (F3), R4 (F4) and R6 (F6), at these time points, since pulses do not appear successively, an 'L' level is supposed to be outputted to both the S_RH and the S_FH. But by erroneous detection, at the R3 and the R4, an 'H' level is outputted to the S_RH, and at the R6, an 'H' level is outputted to the S_FH. This is because of delay time of the SR50, for example, although a latch result of the SR50 after reflection of the F3 is supposed to be taken into the FF50 at the R3, a value of the SR50 before the reflection of the F3 is taken into the FF50. These erroneous detections occur when a pulse of the A1 and a pulse of the A2 appear at an extremely close interval.

In the cases of the R3 and the R4, correct frequency comparison results are obtained as a result, but in the case of the R6, a truly erroneous result occurs. Note that, since a probability of occurrence of this truly erroneous result is lower than that of occurrence of a correct result, even if it is used as it is for control of the oscillation frequency, the frequency converges to a correct frequency. However, when the truly erroneous result occurs, the frequency control is performed in a wrong direction at each time, and the time required for convergence of the frequency to the correct frequency is lengthened. Accordingly, by eliminating this erroneous detection, it is expected that the time for convergence of the frequency control is shortened.

And, the technique of Patent Document 3 is, as it were, technique comparing frequency difference between an external clock signal and a ring oscillator by a counter and controlling a voltage of a transistor connected to a power supply route with feed-backing the comparison result. However, if the counter is used, since it takes time until the comparison result is obtained, it takes much time until a steady state is achieved via feedback control, and circuit scale is increased. Furthermore, in the technique of Patent Document 3, special consideration to control transistor voltage precisely is not made and there is a possibility that delay time of a logic circuit cannot be adjusted precisely. Accordingly, technique enabling adjustment of the delay time of a logic circuit with high accuracy or at high speed is required.

The present invention is made in view of the foregoing subject and the above and other objects and novel characteristics of the present invention will be apparent from the description of this specification and the accompanying drawings.

The typical ones of the inventions disclosed in this application will be briefly described as follows.

A semiconductor integrated circuit device according to the present invention is one comprising first and second transistors inserted in series between a power source in a high potential side and a first output node, third and fourth transistors inserted in series between a power source in a low potential side and the first output node and a capacitance element storing an electric charge charged and discharged via the first output node. Here, the first transistor and the third transistor are driven ON when conducting one power source and the first output node, and the second transistor and the fourth transistor are driven OFF when shutting the conduction state of one power source and the first output node. If transistors for conduction and transistors for shutting the conduction are provided separately in this manner, for example, conduction time can be set by time difference between an edge of a pulse at transition of the first transistor to an ON state and an edge of a pulse at transition of the second transistor to an OFF state. Accordingly, in comparison with a case in which the conduction time is set by ON/OFF of one transistor, a shorter conduction time can be set. Thereby, an amount of the electric charge stored in the capacitance element can be adjusted precisely.

And, the semiconductor integrated circuit device according to the present invention is one comprising a frequency comparison circuit performing comparison between a frequency of a first signal and a frequency of a second signal and means to invalidate a part or whole of an erroneous comparison result outputted from this frequency comparison circuit. Thereby, a control circuit performing various controls using this frequency comparison result is prevented from performing erroneous control.

In concrete, the frequency comparison circuit compares the same edges of the first signal and the second signal, or a rising edge of one signal and a falling edge of the other signal. At this time, when the edge of one signal appears twice or more between two sequential edges of the other signal, it is judged that the one signal has a higher frequency and, for example, an 'H' level is outputted to a first comparison node, and in an opposite case, it is judged that the other signal has a higher frequency, and, for example, an 'H' level is outputted to a second comparison node. And, in response to such a comparison result of the frequency comparison circuit, the means to invalidate is realized by a circuit that invalidates an 'H' level of one node of the first comparison node and the second comparison node when an 'H' level appears in the one node within a predetermined time after an 'H' level appears in the other node. This circuit performs logic calculation, for example, memorizing respective levels of the first comparison node and the second comparison node for predetermined clock cycles by shift registers, and when an 'H' level is outputted to the first comparison node at a certain cycle, validating this 'H' level under condition that an 'H' level is not memorized in a shift register corresponding to the second comparison node.

Further, as another method of realizing the means to invalidate, two pieces of the frequency comparison circuit mentioned above may be provided. In this case, a first frequency comparison circuit performs the comparison operation described above for the same edges of the first signal and second signal, or a rising edge of one signal and a falling edge of the other signal (that is, different edges). On the other hand, a second frequency comparison circuit performs the comparison operation for different edges when the first frequency comparison circuit performs the comparison operation for the same edges, and performs the comparison operation for the same edges when the first frequency comparison circuit performs the comparison operation for different edges.

By this configuration, the first frequency comparison circuit outputs the frequency comparison result in a state where the edge of the first signal is close to that of the second signal, and then, when phases of the first signal and the second signal moves nearly a half of the cycle, the second frequency comparison circuit outputs the frequency comparison result in a state where the edge of the first signal is close to that of the second signal. In this state in which the edge of the first signal is close to that of the second signal, as mentioned above, there is a possibility that an erroneous comparison result is included in frequency comparison results outputted continuously, but at least a first frequency comparison result is a correct (correct as a result) comparison result. Therefore, a circuit which uses the frequency comparison result of the first frequency comparison circuit that appears first after the second frequency comparison circuit outputs the frequency comparison result as a correct comparison result, and after using this first correct comparison result, does not use the frequency comparison result of the first frequency comparison circuit until the second frequency comparison circuit outputs the frequency comparison result next is provided.

The frequency comparison circuit and the means to invalidate erroneous comparison results described above are useful in application to a PLL circuit and the like, for example. In this application, since erroneous frequency control based on an erroneous comparison result can be suppressed, the time for convergence of an oscillation frequency of the PLL circuit can be shortened. Further, if the semiconductor integrated circuit in which an electric charge amount stored in a capacitance element can be adjusted precisely mentioned above is applied to a PLL circuit as a charge pump circuit, an oscillation frequency of the PLL circuit can be adjusted precisely, and as a result, jitter and the like of the PLL circuit can be reduced. And, the semiconductor integrated circuit device according to the present invention is useful when applied to not only the PLL circuit but also various feedback control systems similar to the PLL circuit. As an example, a system in which delay time of a logic circuit is adjusted by feedback control using a voltage controlled oscillation circuit can be considered.

The effects obtained by typical aspects of the present invention are described briefly. In a feedback control system represented by a PLL circuit and the like, control thereof can be performed precisely. Further, speed of the control can be increased.

BRIEF DESCRIPTIONS OF THE DRAWINGS

FIG. 11A is a diagram for explaining the operation of the PLL circuit in FIG. 10, and is a waveform diagram showing an operation example of two frequency comparison circuits;

FIG. 11B is a diagram for explaining the operation of the PLL circuit in FIG. 10, and is a waveform diagram of a part of signals in FIG. 11A observed for a long period;

FIG. 12 is a circuit diagram showing a configuration example of a charge pump control circuit in the PLL circuit in FIG. 10;

Figure 21A:
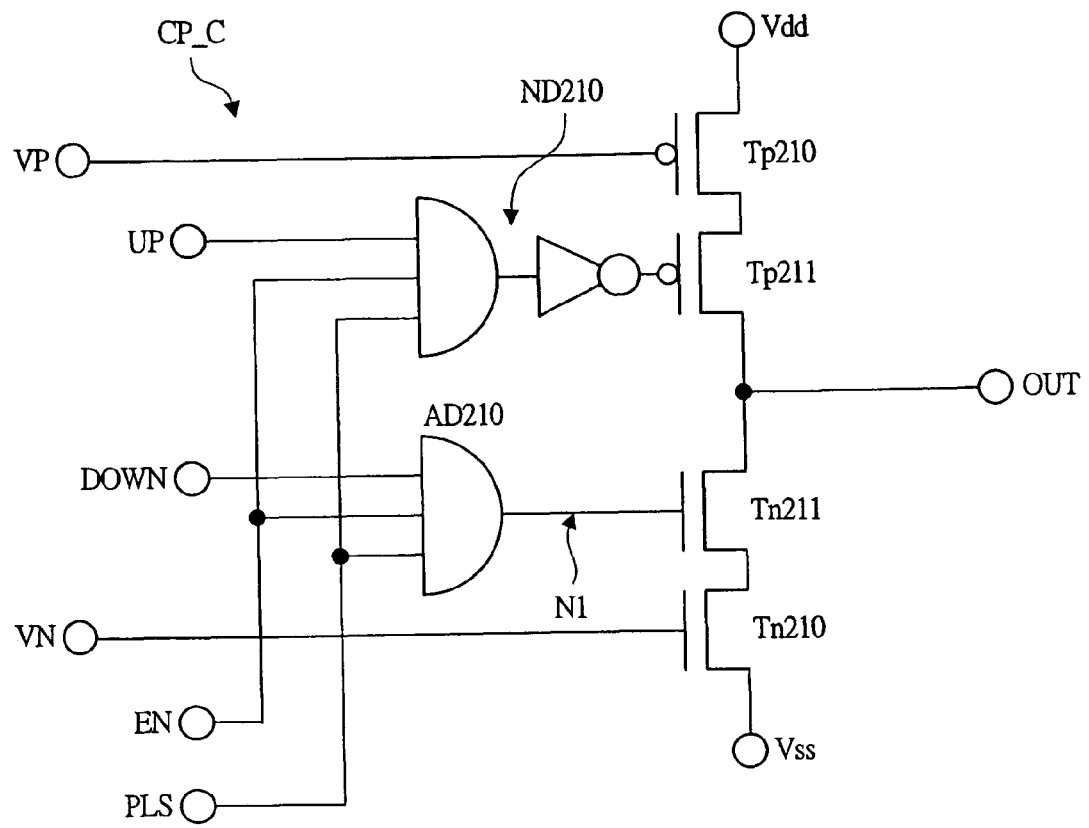
Figure 21B:
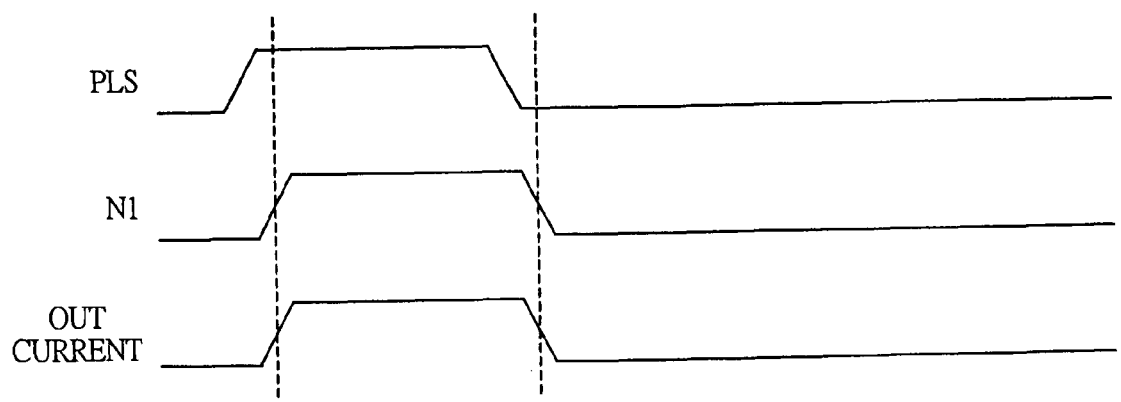

FIG. 21A is a diagram showing an example of the charge pump circuit in the PLL circuit examined as a premise of the present invention and is a circuit diagram showing a schematic configuration example thereof; and FIG. 21B is a diagram showing an example of the charge pump circuit in the PLL circuit examined as a premise of the present invention and is a waveform diagram showing an operation example of a circuit of FIG. 21A.

DESCRIPTIONS OF THE PREFERRED EMBODIMENTS

In the following embodiments, a description will be given by dividing into a plurality of sections or embodiments as occasion demands as a matter of convenience, however, the elements are not nothing to each other except a particularly clear description, but one is a modified example, details, a supplementary explanation or the like of a part or a whole of the other. Further, in the following embodiments, in the case of referring to a number of elements (including a number, a numerical value, an amount, a range and the like), the present invention is not limited to the defined number except the case of the particular definition and the case of apparently limited to the specific number in principle, but may be equal to or more than the defined number or equal to or less than the defined number. Note that, the same components are denoted by the same reference symbols throughout the drawings for describing the embodiment, and the repetitive description thereof will be omitted.

Further, a circuit element configuring respective function blocks of the embodiments is, although not limited in particular, formed over a semiconductor substrate such as single crystal silicon by known integrated circuit technique such as CMOS (complementary MOS transistor) and the like. In the embodiment, as an example of a transistor, an MISFET (Metal Insulator Semiconductor Field Effect Transistor) is used, and as an example thereof, an MOS (Metal Oxide Semiconductor) transistor is used. In respective drawings, a circle mark is allotted to a gate of a P-channel-type MOS transistor (PMOS transistor) to distinguish from an N-channel-type MOS transistor (NMOS transistor).

First Embodiment

Figure 1:
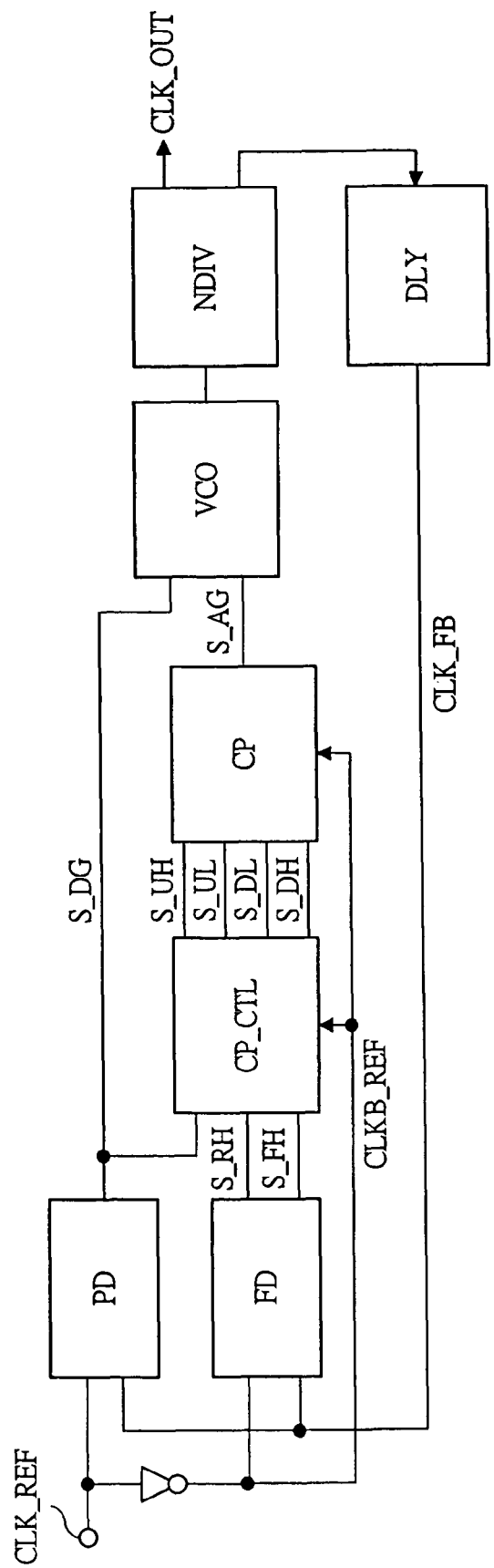
FIG. 1 is a block diagram showing a configuration example of a PLL circuit included in a semiconductor integrated circuit device according to a first embodiment of the present invention.

FIG. 1 is a block diagram showing a configuration example of a PLL circuit included in a semiconductor integrated circuit device according to a first embodiment of the present invention. The semiconductor integrated circuit device (PLL circuit) shown in FIG. 1 comprises a phase comparison circuit PD, a frequency comparison circuit FD, a charge pump control circuit CP_CTL, a charge pump circuit CP, a voltage controlled oscillation circuit VCO, a frequency-division circuit NDIV, a delay circuit DLY and the like. The voltage controlled oscillation circuit VCO receives a digital control signal S_DG and an analog control signal S_AG, and generates a clock signal having an oscillation frequency controlled based on these signals.

The frequency-division circuit NDIV divides a frequency of a clock signal generated by the VCO, and outputs this divided clock signal CLK_OUT. This CLK_OUT is supplied to respective flip-flop circuits and the like via a supply route such as a clock tree and the like included in the semiconductor integrated circuit device. Further, the frequency-division circuit NDIV divides the frequency of the clock signal generated by the VCO for feedback, and this divided signal becomes a feedback clock signal (feedback signal) CLK_FB via the delay circuit DLY. Note that, the delay circuit DLY has a delay amount reflecting a clock distribution route from the frequency-division circuit NDIV to respective flip-flop circuits and is provided for adjusting a phase of the CLK_OUT at a time point of being inputted actually to respective flip-flop circuits to a phase of a reference clock signal (reference signal) CLK_REF.

The phase comparison circuit PD compares the reference signal CLK_REF and the feedback signal CLK_FB and outputs the digital control signal S_DG which is a result of the comparison to the VCO and the charge pump control circuit CP_CTL. The frequency comparison circuit FD compares a frequency of an inverted reference signal CLKB_REF obtained by inverting the CLK_REF and a frequency of the CLK_FB and outputs two frequency comparison signals S_RH and S_FH as a result of the comparison to the CP_CTL.

The charge pump control circuit CP_CTL receives the digital control signal S_DG and the frequency comparison signals S_RH, S_FH, performs various processings in synchronization with the CLKB_REF and outputs four control signals S_UH, S_UL, S_DL and S_DH to the charge pump circuit CP. The S_UH is outputted when the frequency is to be increased largely and the S_UL is outputted when the frequency is to be increased slightly. On the other hand, the S_DH is outputted when the frequency is to be decreased largely and the S_DL is outputted when the frequency to be decreased slightly. The charge pump circuit CP receives the four control signals S_UH, S_UL, S_DL and S_DH from the CP_CTL, operates in synchronization with the CLKB_REF and outputs a current signal corresponding to these control signals as the analog control signal S_AG.

Figure 5:
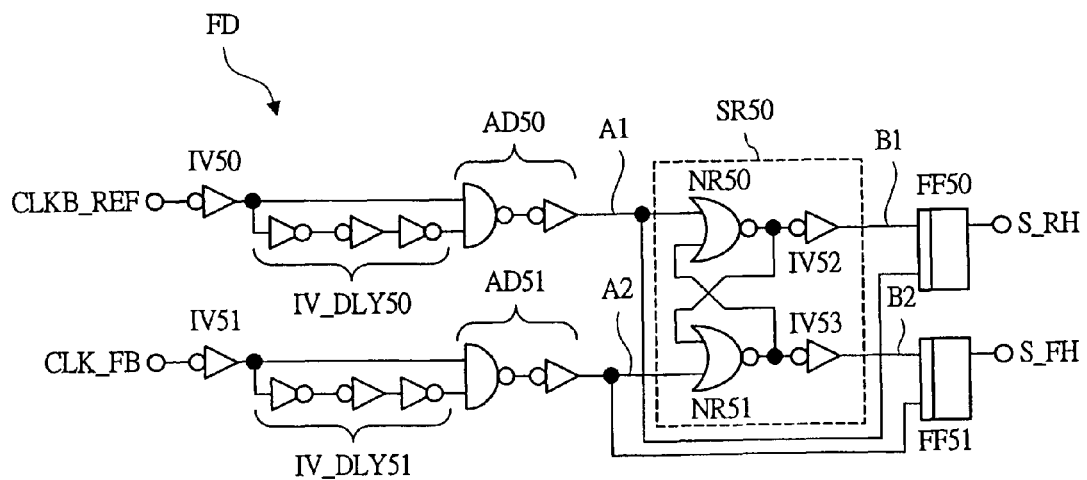
FIG. 5 is a circuit diagram showing a schematic configuration example of a frequency comparison circuit included in the PLL circuit examined as a premise of the present invention.
Figure 6:
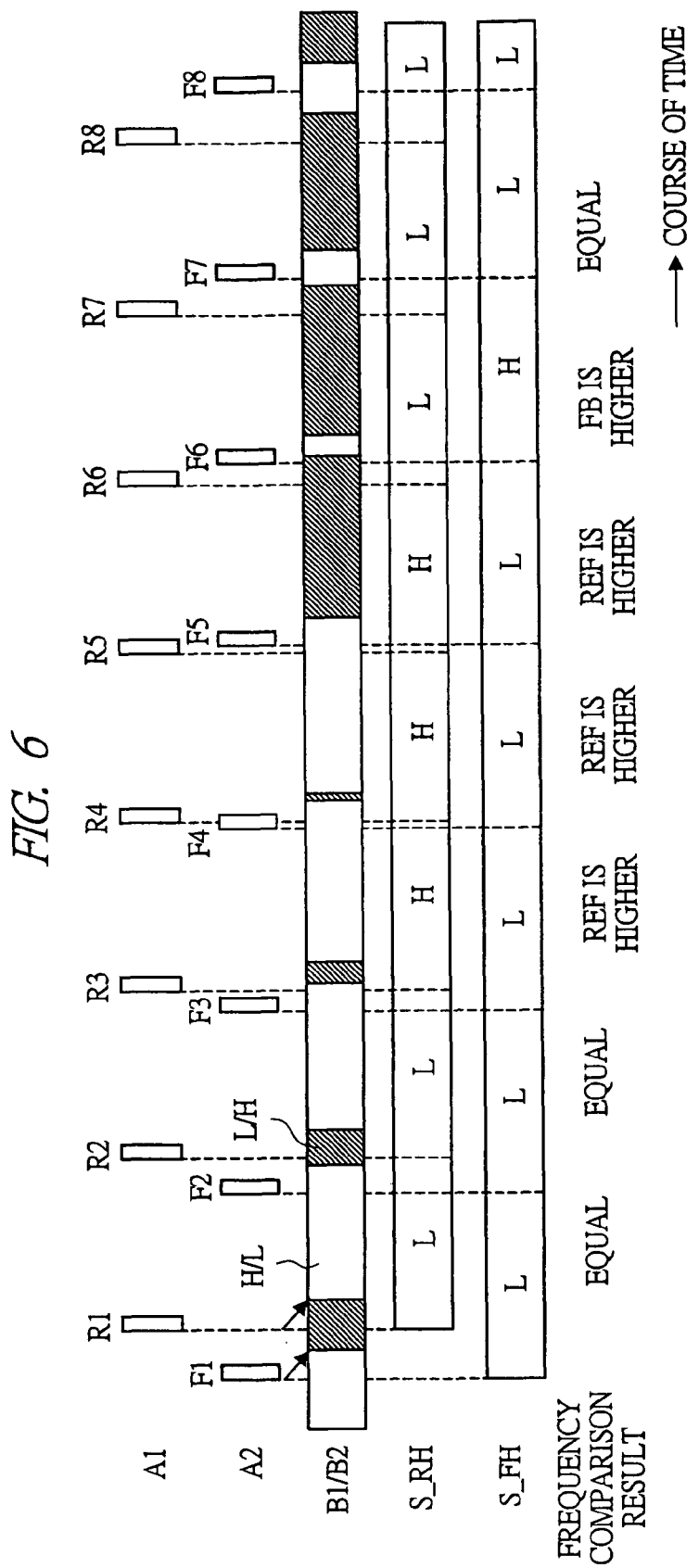
FIG. 6 is an explanatory diagram showing an example of operation of the frequency comparison circuit FD in FIG. 5.

Here, in concrete, the frequency comparison circuit FD in FIG. 1 has the above mentioned configuration of FIG. 5 and the operation of FIG. 6. Accordingly, as mentioned above, when the frequency of the inverted reference signal CLKB_REF (inverted signal of the reference signal CLK_REF) is higher than that of the feedback signal CLK_FB, an 'H' level is outputted to the signal S_RH, and in an opposite case, an 'H' level is outputted to the signal S_FH. Note that, the frequency comparison is carried out using the CLKB_REF not the CLK_REF, because phases of the CLK_REF and the CLK_FB are the same in a steady state and these fall edges do not always appear alternately. Therefore, in FIG. 5, a configuration in which by using the CLKB_REF, it is judged whether the rising edge of the CLK_REF and the falling edge of the CLK_FB appear alternately is employed.

However, in the frequency comparison circuit FD in FIG. 5, as mentioned with reference to FIG. 6, there is a possibility that an erroneous operation occurs. Therefore, in the first embodiment, although details are mentioned with reference to FIG. 7, a mechanism to eliminate this erroneous operation is provided in the charge pump control circuit CP_CTL, and this is one of main characteristics thereof. Further, as mentioned with reference to FIGS. 21A and 21B, the charge pump circuit CP in FIG. 1 is required to adjust the charge amount precisely according to the control signals. Therefore, in the first embodiment, although details are mentioned with reference to FIGS. 8A to 9, a charge pump circuit enabling this precise current adjustment is provided and this is another one of the main characteristics.

Figure 2:
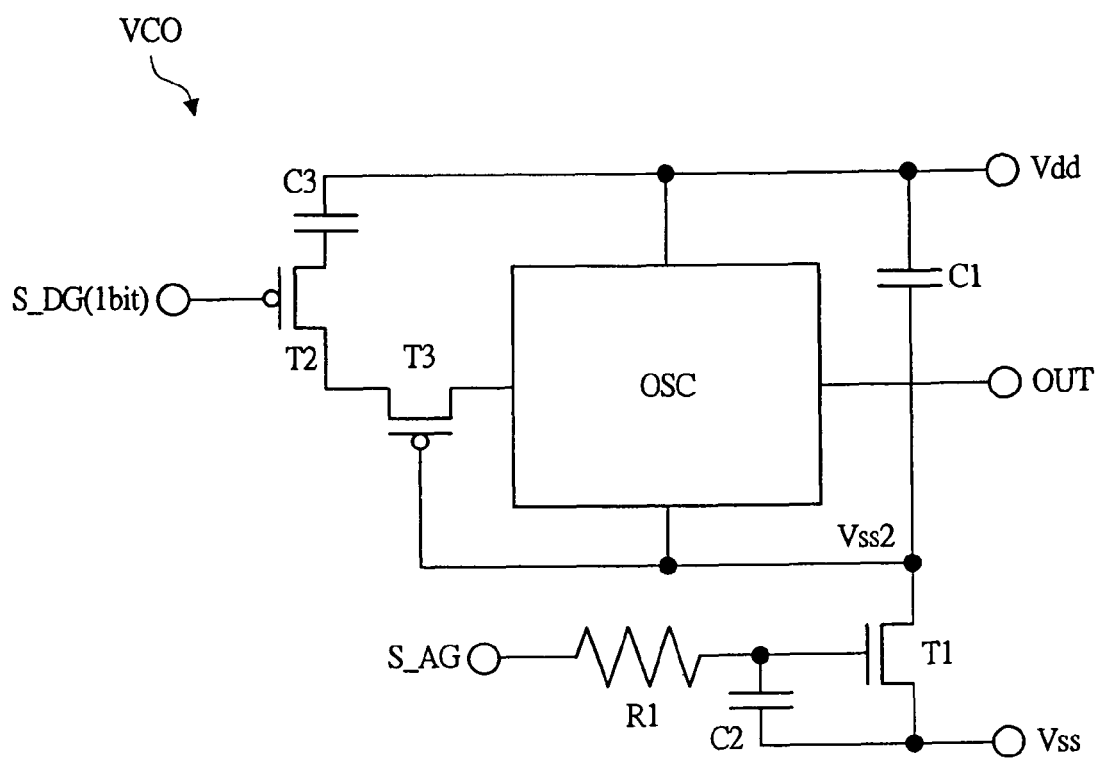
FIG. 2 is a circuit diagram showing a schematic configuration example of a voltage controlled oscillation circuit included in a PLL circuit examined as a premise of the present invention.
Figure 3:
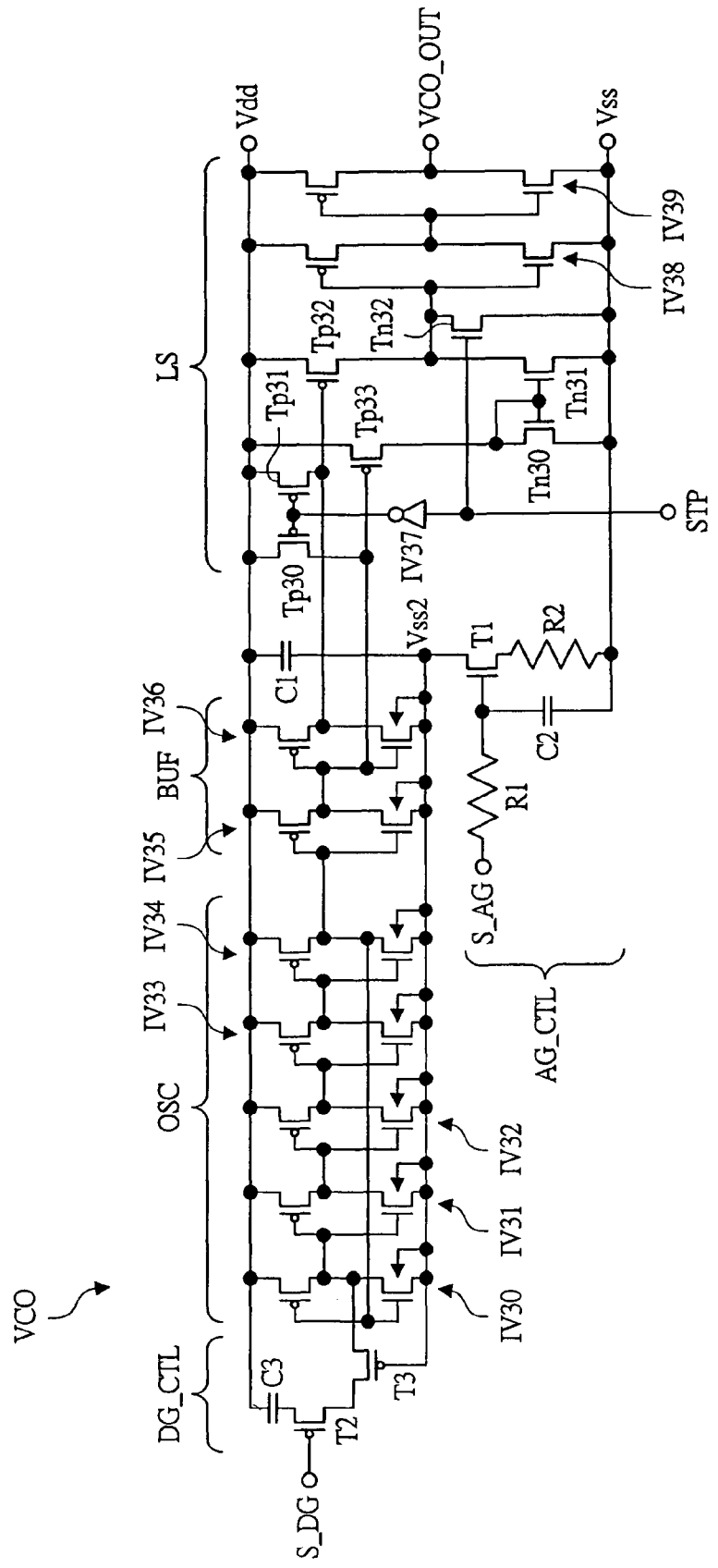
FIG. 3 is a circuit diagram showing a detailed configuration example of a voltage controlled oscillation circuit in the PLL circuit in FIG. 1.

FIG. 3 is a circuit diagram showing a detailed configuration example of a voltage controlled oscillation circuit in the PLL circuit in FIG. 1. The voltage controlled oscillation circuit VCO in FIG. 3 shows a further detailed configuration example than the VCO mentioned in FIG. 2 and comprises a digital control unit DG_CTL, a ring oscillator circuit OSC, a buffer circuit BUF, a level shift circuit LS and an analog control unit AG_CTL. The OSC comprises CMOS inverter circuits IV30 to IV34 of stages of odd number (5 stages in this example) connected between the power source voltage node (power source voltage) Vdd and the second ground voltage node (second ground voltage) Vss2. An output node of the IV34 as a fifth stage is fed back to an input node of the IV30 as a first stage and by this ring configuration, oscillation operation is carried out. Note that, for convenience, here, the Vss2 (and Vss) is referred to as the ground voltage, but when the Vdd is set as the power source voltage in a high potential side, the Vss2 (and Vss) corresponds to the power source voltage in a low potential side.

The digital control unit DG_CTL comprises, as mentioned in FIG. 2, the capacitance C3, the PMOS transistor T2 and the PMOS transistor T3 connected in series in order between the Vdd and the inside node of the OSC (here, an output node of the IV30 as the first stage). To a gate of the T2, the digital control signal S_DG is inputted, and a gate of the T3 is connected to the Vss2. The buffer circuit BUF comprises, for example, two stages of CMOS inverter circuits IV35 and IV36 connected between the Vdd and the Vss2 and to an input node of the IV35 as the first stage, an output node of the OSC (the output node of the IV34) is connected. This buffer circuit BUF is provided to reduce a load to the output node of the OSC.

The level shift circuit LS is connected between the Vdd and the first ground voltage node (first ground voltage) Vss, and for example, comprising a differential amplifier circuit composed of PMOS transistors Tp32, Tp33 and NMOS transistors Tn30, Tn31, two stages of CMOS inverter circuits IV38, IV39 connected to an output node thereof and the like. The Tp32 and the Tp33 operate as a pair of differentials, a gate of the Tp32 is connected to the output node of the IV36 in the BUF and a gate of the Tp33 is connected to the input node of the IV36 (output node of the IV35) in the BUF. The Tn30 and the Tn31 configure a current mirror circuit and function as load current sources of the differential amplifier circuit by being connected to drains of the Tp33 and the Tp32. The drain of the Tp32 is connected to the input node of the CMOS inverter circuit IV38 at the first stage, and from the CMOS inverter circuit IV39 at the second stage, an oscillation output signal VCO_OUT is obtained.

This level shift circuit LS is provided to convert an oscillation signal oscillating between the Vdd and the Vss2 into an oscillation signal of full oscillation oscillating between the Vdd and the Vss. Note that, the level shift circuit LS in FIG. 3, further, in addition to such a configuration, comprises PMOS transistors Tp30, Tp31, an NMOS transistor Tn32 and an inverter circuit IV37 for receiving a stop signal STP and fixing the oscillation output signal VCO_OUT to an 'L' level. When the stop signal STP becomes an 'H' level, an 'L' level is applied to gates of the Tp30 and the Tp31 via the IV37, and the Vdd is applied to gates of the Tp33 and the Tp32 via the Tp30 and the Tp31 that are made ON. Further, an 'H' level of the STP is applied also to a gate of the Tn32, and an input node of the IV38 is fixed to an 'L' level (Vss) via the Tn32 that is made ON. Further, as mentioned later in FIG. 9, when the STP becomes an 'H' level, the S_AG becomes potential of the Vss and the T1 transits to a cut-off state. Therefore, since consumption power can be set to zero by making the STP an 'H' level, it is useful in a test, fault diagnosis and the like, for example.

The analog control unit AG_CTL has a configuration comprising the NMOS transistor T1, the low pass filter composed of the resistor R1 and the capacitance C2 connected to the gate of T1 as described in FIG. 2, and in addition, a resistor R2. The drain of the T1 is connected to the Vss2, and the source thereof is connected to the Vss via the resistor R2. And, to the gate of the T1, the analog control signal S_AG is inputted via the low pass filter mentioned above. Here, the resistor R2 is provided to suppress fluctuation of a current flowing to T1 at occurrence of voltage fluctuation between the Vss2 and the Vss.

Figure 4:
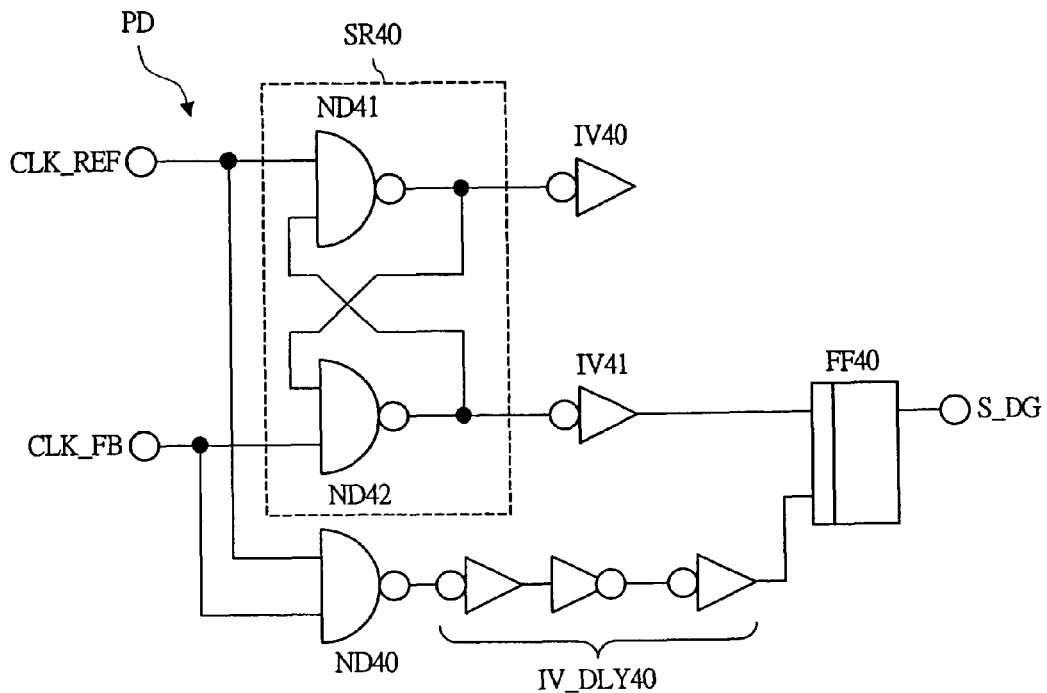
FIG. 4 is a circuit diagram showing a detailed configuration example of a phase comparison circuit in the PLL circuit in FIG. 1.

FIG. 4 is a circuit diagram showing a detailed configuration example of a phase comparison circuit in the PLL circuit in FIG. 1. The phase comparison circuit PD shown in FIG. 4 comprises a set reset latch circuit SR40, a NAND circuit ND40, a delay circuit IV_DLY40, inverter circuits IV40, IV41 and a flip-flop circuit FF40. The SR40 comprises two NAND circuits ND41 and ND42, to one input node of the ND41, the reference signal CLK_REF is inputted, and to one input node of the ND42, the feedback signal CLK_FB is inputted. And, to the other input node of ND41, an output node of the ND42 is connected, and to the other input node of the ND42, an output node of the ND41 is connected.

In the ND40, to one input node, the reference signal CLK_REF is inputted, and to the other input node, the feedback signal CLK_FB is inputted. An output of the ND40 is used for a clock trigger of the FF40 via the delay circuit IV_DLY40 composed of three stages of inverter circuits here. To a data input node of the FF40, the output node of the ND42 is connected via the IV41. Note that, the IV40 connected to the output node of the ND41 is provided to make balance equal with a load to the output of the ND42. This phase comparison circuit PD detects which of the rising edge of the CLK_REF and the rising edge of the CLK_FB appears first by the SR40, takes a result of the detection into the FF40 and outputs the same as the digital control signal S_DG from the FF40.

Figure 7:
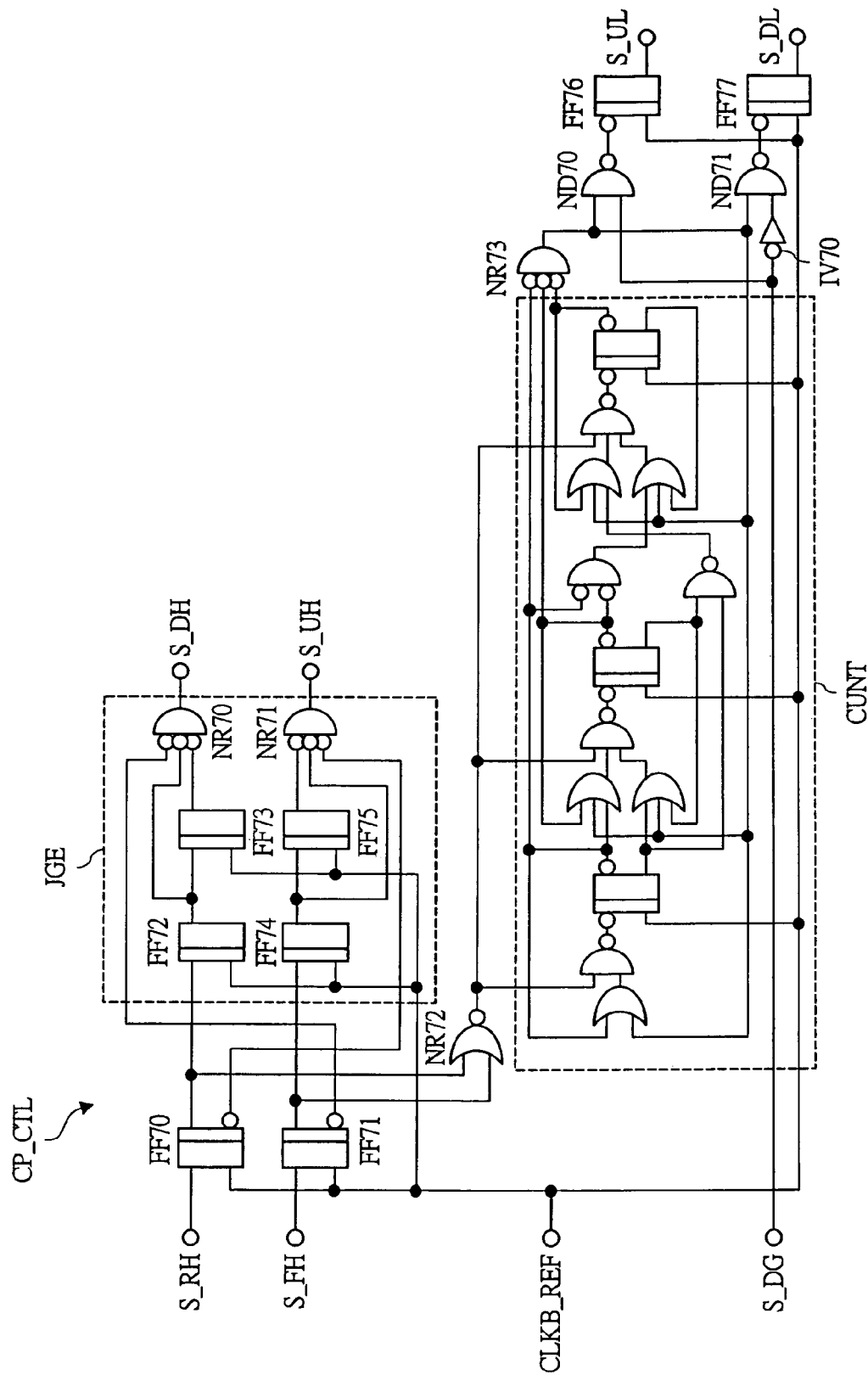
FIG. 7 is a circuit diagram showing a configuration example of a charge pump control circuit in the PLL circuit in FIG. 1.

FIG. 7 is a circuit diagram showing a configuration example of a charge pump control circuit in the PLL circuit in FIG. 1. The charge pump control circuit CP_CTL in FIG. 7 comprises a judgment circuit JGE processing the signals S_RH, S_FH from the frequency comparison circuit FD mentioned above and outputting control signals S_DH, S_UH, a counter circuit count processing the signals S_RH, S_FH and the digital control signal S_DG and outputting control signals S_UL, S_DL and the like. This charge pump control circuit CP_CTL has a characteristic that the judgment circuit JGE to prevent the erroneous operation mentioned in FIG. 6 is provided.

The signals S_RH, S_FH are taken into flip-flop circuits FF70, FF71 respectively in synchronization with the inverted reference signal CLKB_REF. The judgment circuit JGE comprises flip-flop circuits FF72 to FF75 and NOR circuits NR70, NR71. The FF72 and the FF73 operate in synchronization with the CLKB_REF, and function as shift registers to an output signal of the FF70. The FF72 takes in the output signal of the FF70, and the FF73 takes in an output signal of the FF72. In the same manner, the FF74 and the FF75 operate in synchronization with the CLKB_REF, and function as shift registers to an output signal of the FF71. The FF74 takes in the output signal of the FF71, and the FF75 takes in an output signal of the FF74.

The NR70 performs NOR calculation of an inverted output signal of the FF71, the output signal of the FF72 and the output signal of the FF73, and outputs the result as the control signal S_DH. On the other hand, the NR71 performs NOR calculation of an inverted output signal of the FF70, the output signal of the FF74 and the output signal of the FF75, and outputs the result as the control signal S_UH. As mentioned in FIG. 1, the control signal S_DH is the signal to decrease the frequency largely and the S_UH is the signal to increase the frequency largely.

This judgment circuit JGE has a function to invalidate the comparison result made later, in a case where just after the frequency comparison circuit FD judges that the frequency of one signal of the reference signal CLK_REF and the feedback signal CLK_FB is higher, judgment that the frequency of the other signal is higher is made. That is, as apparent from FIG. 6 mentioned above, the true erroneous detection (the R6 and the F6 in FIG. 6) occurs in some cycles just after the correct detection (the R5 and the F5 in FIG. 6). And, when the erroneous detection occurs, the correct judgment result always appears just before it. Furthermore, although the true erroneous detection continues for only one cycle in FIG. 6, it may continue for several cycles, and in such a case, the correct detection result (correct detection result as a result) appears continuously for several cycles before it. Based on such nature, if the erroneous detection result outputted in some cycles just after the correct detection result can be invalidated, convergence of the frequency control as the PLL circuit can be hastened.

Therefore, in the judgment circuit JGE in FIG. 7, if a cycle at the present time point is defined as t[0], the previous cycle is defined as t[−1] and the cycle previous by two cycles is defined as t[−2], for example, when the S_FH becomes an 'H' level at t[0], this result is made valid when the S_RH at t[−1] and t[−2] are 'L' levels (that is, when a result of an opposite side is not outputted before two cycles). And the control signal S_DH reflecting this logic calculation result is outputted. In the same manner, when the S_RH becomes an 'H' level at t[0], this result becomes valid when the S_FH at t[−1] and t[−2] are 'L' levels, and the control signal S_UH reflecting this logic calculation result is outputted. And, in other words, the frequency comparison result taken in at a cycle of the present time point becomes invalid when the frequency comparison result of the opposite side is outputted in before two cycles.

Using the judgment circuit JGE described above, in the example of FIG. 6, the frequency comparison results in the R3 to the R5 (the F3 to the F5) become valid and the frequency comparison result at the R6 (the F6) becomes invalid. Further, if erroneous detections continue and the comparison result of the erroneous detection is outputted at the R7 (the F7), the comparison result becomes invalid. Note that, although the frequency comparison results in the R3 and the R4 (the F3 and the F4) are correct results as results, since these results works in a direction of hastening the convergence of the frequency control, these results can be regarded to be valid. Further, here, a configuration in which when erroneous detections continue, that of two cycles are invalidated is employed, but the number of the cycles can be adjusted by the number of stages of the shift register in the judgment circuit JGE, of course. As the number is large, the time of the convergence can be reduced, but circuit scale becomes large accordingly. Therefore, it may be changed appropriately according to need. With at least one cycle, it is useful in comparison with a case in which the invalidation of erroneous detection is not carried out.

Further, in FIG. 7, the output signals of the FF70 and the FF71 are calculated by the NOR circuit NR72 and a result of the calculation is inputted to the counter circuit count. The count is a 3-bit counter here, and counts in synchronization with the CLKB_REF when the output signals of the FF70 and the FF71 are both 'L' levels. And, when the output signals of the FF70 and the FF71 are 'L' levels continuously for 8 cycles (for 3 bits), an 'H' level is outputted via the NOR circuit NR73 and by this 'H' level, two NAND circuits ND70 and ND71 are enabled.

One input node of the ND70 is connected to the output node of the NR73, and to the other input node, the digital control signal S_DG is inputted. One input node of the ND71 is connected to the output node of the NR73, and to the other input node, a signal obtained by inverting the digital control signal S_DG by the inverter circuit IV70 is inputted. That is, this charge pump control circuit CP_CTL has a configuration in which the ND70 and the ND71 are validated at a stage when the CUNT counts an 'L' level for 8 cycles and thereby it is considered that the frequencies become nearly equal, and control using the digital control signal S_DG (phase comparison result) is validated.

The output signal of the ND70 is inverted and then taken in by the flip-flop circuit FF76 using the CLKB_REF as a clock trigger, and the control signal S_UL is outputted from the FF76. On the other hand, the output signal of the ND71 is inverted and then taken in by the flip-flop circuit FF77 using the CLKB_REF as a clock trigger, and the control signal S_DL is outputted from the FF77. As described in FIG. 1, the S_UL is a signal to increase the frequency slightly, and the S_DL is a signal to decrease the frequency slightly.

By use of such a configuration, when the oscillation frequency is far from the target frequency, the frequency comparison result appears frequently, and only the frequency control based on the frequency comparison result is carried out. However, when difference between the oscillation frequency and the target comes to for example below 12.5%, the frequency comparison result does not appear over 8 cycles, and times of the control decreases. And, if the control based on the phase comparison result is made when the difference of frequencies of the reference signal CLK_REF and the feedback signal CLK_FB is large, a possibility of erroneous control is high, but when the difference of frequencies becomes below 12.5%, the possibility of the erroneous control becomes low.

Therefore, after 8 cycles from disappearance of the frequency comparison result, the control based on the phase comparison result is started. Since the oscillation frequency is already close to the target at the time point and the control based on the phase comparison result continues even in a steady state, control is performed to cause slight change. Note that, when the frequency comparison result appears again, control only by the frequency comparison result is carried out, and further, after 8 cycles from disappearance of the frequency comparison result, the control based on the phase comparison result is restarted. Meanwhile, here, a configuration in which 8 cycles are counted is employed, but of course, the number of the cycles can be changed appropriately.

Figure 8A:
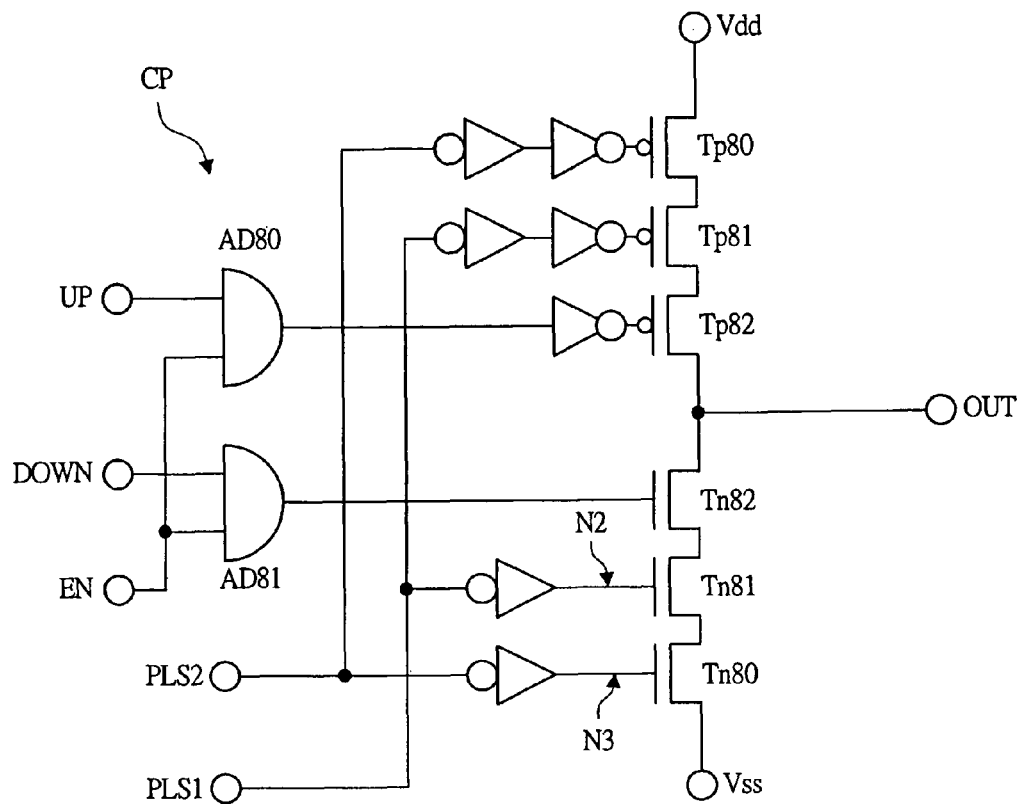
FIG. 8A is a diagram showing outline of a charge pump circuit in the PLL circuit in FIG. 1 and is a circuit diagram showing a schematic configuration example thereof.
Figure 8B:
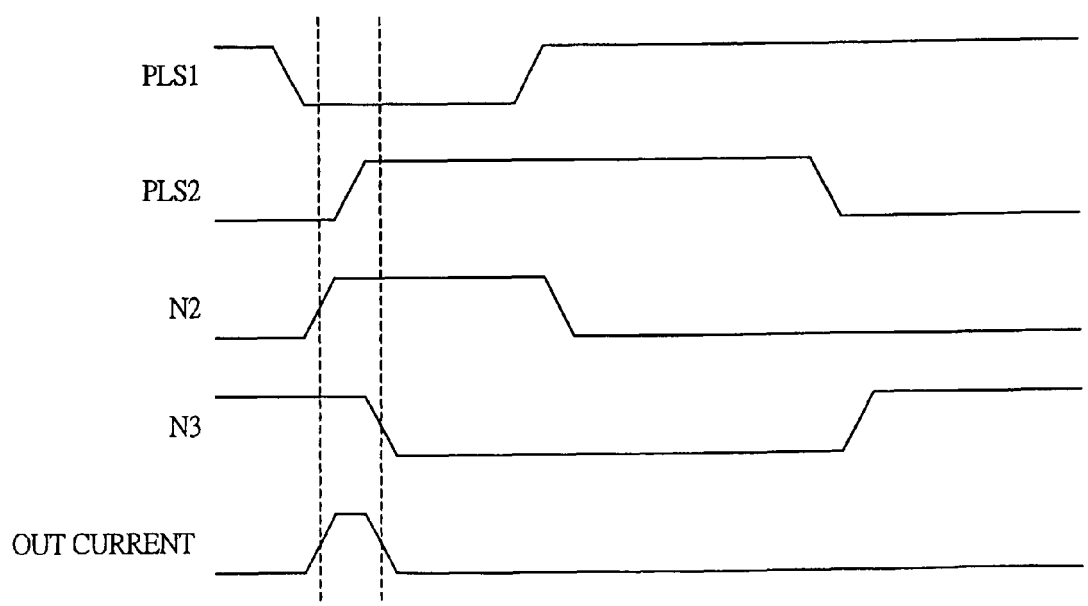
FIG. 8B is a diagram showing the outline of the charge pump circuit in the PLL circuit in FIG. 1 and is a waveform diagram showing an operation example of a circuit of FIG. 8A.

FIGS. 8A and 8B are diagrams showing outline of the charge pump circuit in the PLL circuit in FIG. 1. FIG. 8A is a circuit diagram showing a schematic configuration example thereof, and FIG. 8B is a waveform diagram showing an operation example of the circuit of FIG. 8A. The charge pump circuit CP shown in FIGS. 8A and 8B comprises PMOS transistors Tp80 to Tp82 connected in series in order from the power source voltage Vdd to the output node OUT and NMOS transistors Tn82 to Tn80 connected in series in order from the OUT to the ground voltage Vss. To a gate of the Tp80, a second pulse signal PLS2 is inputted, and to a gate of the Tn80, a signal obtained by inverting the PLS2 is inputted. To a gate of the Tp81, a first pulse signal PLS1 is inputted, and to a gate of the Tn81, a signal obtained by inverting the PLS1 is inputted. And, to the Tp82, a result of calculation of the up signal UP used at increasing the frequency and the enable signal EN by the AND circuit AD80 and inverted is inputted, and to the Tn82, a result of calculation of the down signal DOWN used at decreasing the frequency and the EN by the AND circuit AD81 is inputted.

An operation example in a case of, for example, decreasing the frequency using such a configuration is shown in FIG. 8B. As shown in FIG. 8B, in an initial state, the PLS1 is set to an 'H' level and the PLS2 is set to an 'L' level. Along with this, the Tp80 and the Tn80 are ON, and the Tp81 and the Tn81 are OFF. Here, by the DOWN and the EN, the Tn82 is set to ON, by the UP, the Tp82 is set to OFF, and in this state, first, the PLS1 is transited to an 'L' level. Thereby, a node N2 of the gate of Tn81 transits to an 'H' level, and with transition of the Tn81 to ON, discharge current starts flowing from the OUT to the Vss. Thereafter, if the PLS2 is transited to an 'H' level, a node N3 of the gate of the Tn80 transits to an 'L' level, and the discharge current is shut down with transition of the Tn80 to OFF.

Thereafter, in order to prevent the discharge current from further flowing, the PLS1 is returned to an 'H' level and the Tn81 is set OFF, then, the PLS2 is returned to an 'L' level and the Tn80 is set ON. Note that, in a case of increasing the frequency, similar processings are performed. The Tp82 is set ON from the initial state by the UP and the EN, and Tn82 is set OFF by the DOWN and in this state, the PLS1 and the PLS2 are transited as shown in FIG. 8B. And, the Tp81 and the Tp80 are controlled. Thereby, from the Vdd to the OUT, charge current flows in time difference of the PLS1 and the PLS2.

Thus, the charge pump circuit CP in FIGS. 8A and 8B has characteristics that a configuration in which transistors (the Tp81 and the Tn81) that get ON when starting flowing current and transistors (the Tp80 and the Tn80) that get OFF when stopping the current are provided separately, and the output current flows for time corresponding to time difference of the falling of the PLS1 and the rising of the PLS2 is employed. And, in other words, it has characteristics that control is performed so that a time in which both of the transistors (the Tp81 and the Tn81) and the transistors (the Tp80 and the Tn80) get ON is shorter than a time in which the transistors (the Tp81 and the Tn81) or the transistors (the Tp80 and the Tn80) get ON individually. Accordingly, in order to shorten the time of flowing of the output current, the time difference of the PLS1 and the PLS2 is shortened, and respective pulse widths of the PLS1 and the PLS2 may be large, and accordingly, for example, it is possible to secure 'H' levels of the nodes N2 and N3 sufficiently.

On the other hand, in the charge pump circuit CP_C mentioned in FIGS. 21A and 21B as a comparison objective, since start and stop of flowing of this current is controlled by one pulse signal PLS and one transistor (the Tp211, the Tn211), if the pulse width is reduced, an 'H' level of the node N1 fluctuates and fluctuations of a value of the output current and flowing time increases, as described above. If the configuration in FIGS. 8A and 8B is employed, the fluctuations can be reduced, and therefore, by shortening the time difference of the PLS1 and the PLS2, the control step of the output charge amount can be reduced, and frequency control of high-precision or high-resolution can be realized. Furthermore, thereby, jitter of the PLL circuit can be reduced.

Note that, in the charge pump circuit CP in FIGS. 8A and 8B, the transistors (the Tp82, the Tn82) controlling whether the current flows the circuit or not are provided separately, but in the charge pump circuit CP_C in FIGS. 21A and 21B, one transistor (the Tp211, the Tn211) mentioned above has this role also. And, in the CP_C in FIG. 21A, transistors (the Tp210, the Tn210) reducing size of the current are indispensable, but in the CP in FIG. 8A, the control step of the charge amount can be reduced by shortening the time of flowing of the current without reducing the size of the current, and therefore, these transistors are not required necessarily. However, of course, by providing these transistors, the control step can be reduced further.

Figure 9:
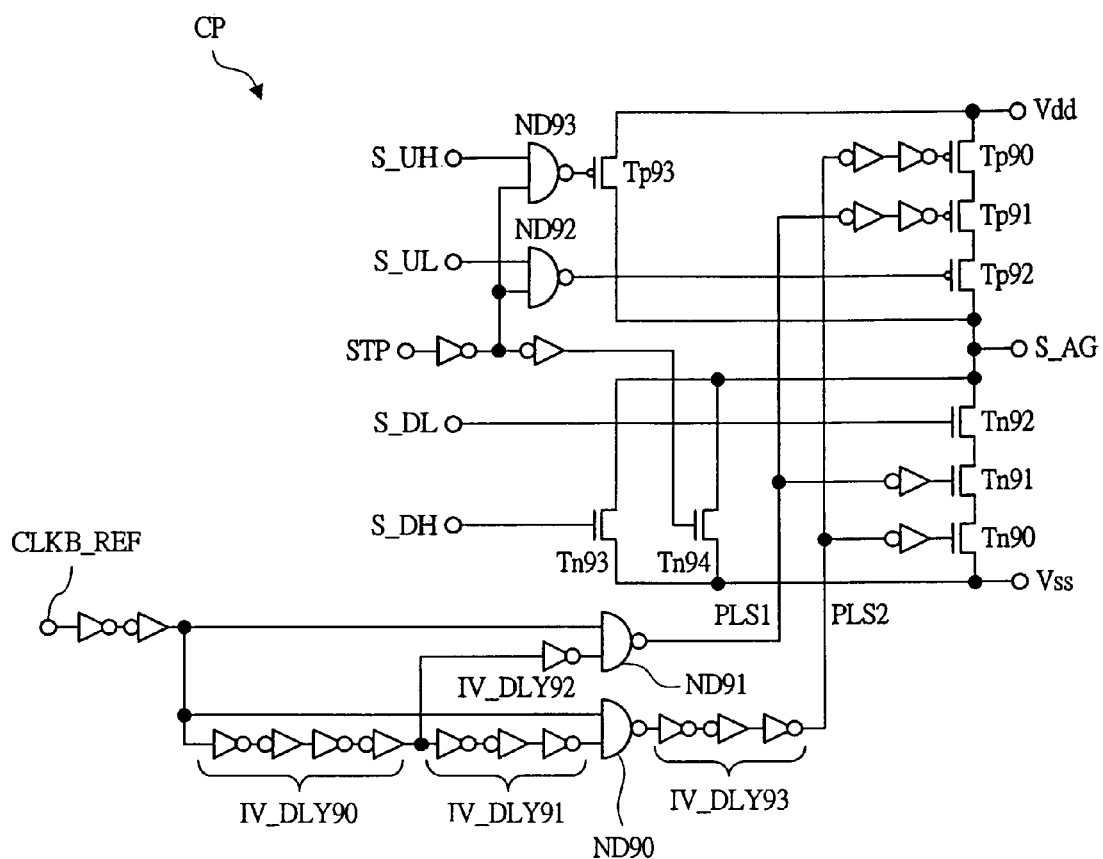
FIG. 9 is a circuit diagram showing a detailed configuration example of the charge pump circuit in the PLL circuit in FIG. 1.

FIG. 9 is a circuit diagram showing a detailed configuration example of the charge pump circuit in the PLL circuit in FIG. 1. The charge pump circuit CP in FIG. 9 has a configuration reflecting the characteristics described using FIGS. 8A and 8B, and comprises PMOS transistors Tp90 to Tp92 corresponding to the Tp80 to the Tp82 in FIG. 8A and NMOS transistors Tn92 to Tn90 correspond to the Tn82 to the Tn80 in FIG. 8A between the power source voltage Vdd and the ground voltage Vss. Here, from an output node corresponding to the drain of the Tp92 (the Tn92), the analog control signal S_AG is outputted.

Further, between the output node of this S_AG and the Vdd, a PMOS transistor Tp93 is connected in parallel with the Tp90 to the Tp92, and between the output node of the S_AG and the Vss, two NMOS transistors Tn93 and Tn94 are connected in parallel with the Tn92 to Tn90 the respectively. To a gate of the Tp91 (and the Tn91), the first pulse signal PLS1 (and an inverted signal thereof) described in FIGS. 8A and 8B is inputted. On the other hand, to a gate of the Tp90 (and the Tn90), the second pulse signal PLS2 (and an inverted signal thereof) described in FIGS. 8A and 8B is inputted.

The PLS1 is generated by calculation of the inverted reference signal CLKB_REF and a signal inverted and delayed, for example, by five stages of inverter circuits in the delay circuits IV_DLY90 and IV_DLY92 by the NAMD circuit ND91. In this case, the PLS1 is an 'L' pulse signal having delay time corresponding to five stages of inverter circuits. On the other hand, the PLS2 is generated by calculation of the CLKB_REF and a signal inverted and delayed, for example, by seven stages of inverter circuits in the delay circuits IV_DLY90 and IV_DLY91 by the NAND circuit ND90, and further, by inverting and delaying the output by a delay circuit IV_DLY93 consisting of three stages of inverter circuits for example. In this case, the PLS2 is an 'H' pulse signal having delay time corresponding to seven stages of inverter circuits, and is a pulse signal rising after falling of the PLS1 with delay corresponding to the IV_DLY93. That is, this delay time of the IV_DLY93 is the time of flowing of the current.

To a gate of the Tp92, a result of calculation of an inverted signal of the stop signal STP and the control signal S_UL by the NAND circuit ND92 is inputted, and to a gate of the Tn92, the control signal S_DL is inputted. Accordingly, the Tp92 gets ON when the control signal S_UL to increase the frequency slightly transits to an 'H' level in a case where the STP is an 'L' level (inactive). On the other hand, the Tn92 gets ON when the control signal S_DL to decrease the frequency slightly transits to an 'H' level. And, when one of the Tp92 and the Tn92 gets ON, by the operation of the pulse control described in FIGS. 8A and 8B, the analog control signal S_AG having the charge amount with small control step is outputted.

To a gate of the Tp93, a result of calculation of an inverted signal of the STP and the control signal S_UH by the NAND circuit ND93 is inputted, and to a gate of the Tn93, the control signal S_DH is inputted. Accordingly, the Tp93 gets ON when the control signal S_UH to increase the frequency largely transits to an 'H' level in a case where the STP is an 'L' level (inactive). On the other hand, the Tn93 gets ON when the control signal S_DH to decrease the frequency largely transits to an 'H' level. The Tp93 and the Tn93 can be designed in the same transistor size as the Tp90 to the Tp92 and the Tn92 to the Tn90, and can be designed so that the Tp93 and the Tn93 are larger. The Tp90 to the Tp92 and the Tn92 to the Tn90 are controlled so that conduction time is reduced as mentioned above, meanwhile, since the Tp93 and the Tn93 are conductive while the S_UH or the S_DH is high level, the control by the Tp93 and the Tn93 is larger than the control by the Tp90 to the Tp92 and the Tn92 to the Tn90 even by this point, but by changing transistor size, the difference can be still larger.

Note that, the stop signal STP is provided in order to set the analog control signal S_AG to the ground voltage Vss and stop oscillation of the VCO at test and the like, for example. When the STP transits to an 'H' level, the Tp92 and the Tp93 are driven OFF via the ND92 and the ND93 and the Tn94 is driven ON, and thereby, the S_AG is connected to the Vss.

As described above, by using the semiconductor integrated circuit device of the first embodiment, unnecessary frequency control along with erroneous detection of the frequency comparison circuit can be suppressed and time for convergence of frequency control in the PLL circuit can be reduced. Further, a control step of a charge amount of the charge pump circuit can be reduced, and a PLL circuit with high precision or small jitter can be realized.

Second Embodiment

In the first embodiment described above, a problem of erroneous detection of the frequency comparison circuit is solved by the method of arranging a judgment circuit in the charge pump control circuit as mentioned in FIG. 7. Meanwhile, in a second embodiment, this problem is solved using a method different from this.

Figure 10:
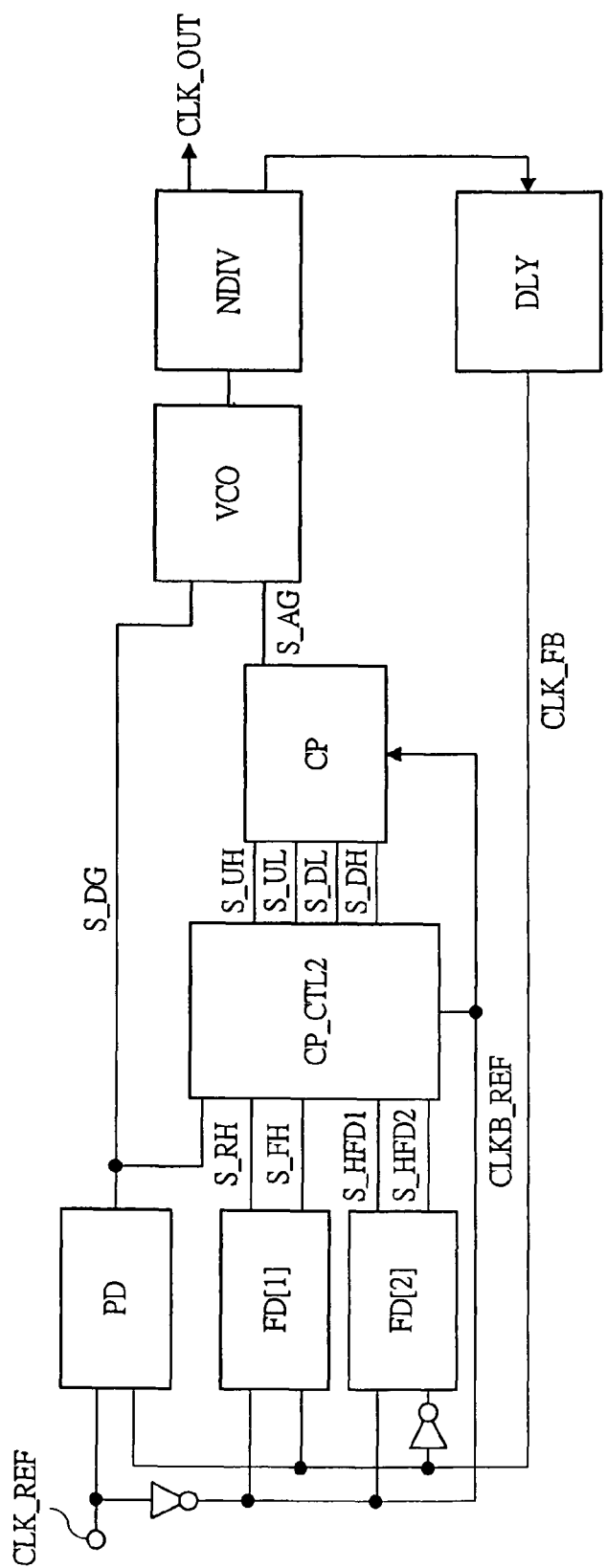
FIG. 10 is a block diagram showing a configuration example of a PLL circuit included in a semiconductor integrated circuit device according to a second embodiment of the present invention.

FIG. 10 is a block diagram showing a configuration example of a PLL circuit included in a semiconductor integrated circuit device according to the second embodiment of the present invention. The PLL circuit shown in FIG. 10 has main characteristics that two frequency comparison circuits FD[1] and FD[2] are provided and a charge pump control circuit CP_CTL2 correspond thereto are provided, in comparison with the PLL circuit shown in FIG. 1. Configuration of the PLL circuit is the same as that in FIG. 1 except these points, and therefore, detailed explanations thereof are omitted.

Although each of the frequency comparison circuits FD[1] and FD[2] has a circuit configuration shown in FIG. 5, phase relation of input signals are different. That is, the FD[1] performs frequency comparison of the inverted reference signal CLKB_REF and the feedback signal CLK_FB, outputs an "H" level to the signal S_RH when the frequency of the reference signal is higher and outputs an 'H' level to the signal S_FH when the frequency of the feedback signal is higher. On the other hand, the FD[2] has a function to detect that the phase moves by half a cycle by performing frequency comparison of the inverted signal of the CLK_FB and the CLKB_REF. Note that, the FD[2] uses the inverted signal in a CLK_FB side, but the inverted signal in a CLKB_REF side can be used. That is, the FD[2] is required to output the signal when timing relation of the CLKB_REF and the CLK_FB displaces by nearly half a cycle from timing relation at a timing when the FD[1] outputs the signal. Further, the FD[2] outputs a signal S_HFD1 when the frequency of one signal is higher and outputs a signal S_HFD2 when the frequency of the other signal is higher, but there is no need to distinguish these, and it is required to detect that the phase moves by half a cycle based on information that either of them is outputted.

The PLL circuit in FIG. 10 operates so that the frequency comparison result appearing while the phase moves over half a cycle after using the frequency comparison result from the FD[1] one time for control is not used, by detecting movement of the phase by half a cycle by the FD[2]. Thereby, the problem of erroneous detection is solved. Hereinafter, a principle of this method is explained in concrete.

FIGS. 11A and 11B are diagrams for explaining operation of the PLL circuit in FIG. 10. FIG. 11A is a waveform diagram showing an operation example of two frequency comparison circuits, and FIG. 11B is a waveform diagram in a case where a part of signals in FIG. 11A is observed for a long period. In FIG. 11A, output examples of the frequency comparison circuits FD[1] and FD[2] in a case where the frequency of the CLKB_REF is slightly higher than but nearly equal to the frequency of the CLK_FB is shown. Since the frequencies of the CLKB_REF and the CLK_FB are nearly equal, during some cycles, the phases of the CLKB_REF and the CLK_FB are nearly identical as shown in left half of FIG. 11A.

And in this period of the left half, the frequency comparison circuit FD[1], as already mentioned in FIG. 6, generates a erroneous detection signal which is correct as a result and a truly correct detection signal (corresponding to an 'H' level of the S_RH in FIG. 11A), and just after that, generates a true erroneous detection signal (corresponding to an 'H' level of the S_FH in FIG. 11A). On the other hand, since the frequency comparison circuit FD[2] compares an inverted signal of the CLK_FB and the CLKB_REF, phases displaces nearly half a cycle, and an 'L' level is outputted to both the S_HFD1 and the S_HFD2.

Further, in this period of the left half, the CLKB_REF passes the CLK_FB, but since the frequencies are slightly different, after a while, as shown in right half of FIG. 11A, the phases of the CLKB_REF and the CLK_FB are displaced by nearly half a cycle. In this right half period, on the contrary to the left half period, the frequency comparison circuit FD[1] outputs an 'L' level to both the S_RH and the S_FH. On the other hand, when viewed from the frequency comparison circuit FD[2], since the period of the right half is a period in which phases are nearly identical, the FD[2] outputs an 'H' level to the S_HFD1, and just after that, outputs an 'H' level to the S_HFD2 in the same manner as the FD[1] in the left half.

The period of the left half and the period of the right half are repeated alternately, and therefore, in the long term, the outputs signals of the FD[1] and the FD[2] become as shown in FIG. 11B. As shown in this drawing, when the phase difference advances for half a cycle after the FD[1] outputs the comparison result, the FD[2] outputs the comparison result, and when the phase difference advances further for half a cycle, the FD[1] outputs the comparison result again. Accordingly, the comparison result of the FD[2] can be used as a signal showing that the phase difference moves half a cycle.

Therefore, using a comparison result of the FD[1] that appears first, control is performed for only one cycle, and after that, the control is not performed until the phase difference moves half a cycle. And, even after it is detected that the phase difference moves half a cycle, using a comparison result that appears first, the control is performed for only one cycle. That is, the comparison results of J1 to J3 in FIGS. 11A and 11B are used. By repeating this, the frequency control can be performed using only the correct comparison result that appears first in a series of frequency comparison results. Further, on the contrary, in a case where the frequency of the CLKB_REF is slightly lower than that of the CLK_FB, the FD[1] outputs first the correct comparison result that the frequency of the CLK_FB is higher (that is, an 'H' level to the S_FH), and then outputs a wrong comparison result that the frequency of the CLKB_REF is higher (that is, an 'H' level to the S_RH). In this case, in the same manner, the frequency control can be performed using only the correct comparison result that appears first in a series of frequency comparison results.

Note that, in a case where the frequency of the CLKB_REF is sufficiently higher than the frequency of the CLK_FB, the frequency comparison circuit does not cause an erroneous operation. Accordingly, in this case, only an 'H' level of the S_RH as a correct comparison result and an 'H' level of the S_HFD1 after half a cycle movement thereof are outputted. On the contrary, in a case where the frequency of the CLKB_REF is sufficiently lower than the frequency of the CLK_FB, only an 'H' level of the S_FH as a correct comparison result and an 'H' level of the S_HFD2 after half a cycle movement thereof are outputted. In any cases, by detecting the half a cycle movement by OR calculation of the S_HFD1 and the S_HFD2, the correct comparison result and the detection of half a cycle movement appear alternately, and accordingly, only correct control is carried out.

FIG. 12 is a circuit diagram showing a configuration example of the charge pump control circuit in the PLL circuit in FIG. 10. In the charge pump control circuit CP_CTL2 in FIG. 12, four control signals S_UL, S_DL, S_UH and S_DH to the charge pump circuit CP are outputted respectively from four flip-flop circuits FF120, FF121, FF122 and FF123 in synchronization with the inverted reference signal CLKB_REF. Among them, two control signals S_UH and S_DH to increase or decrease the frequency largely are inputted to one of two 3-input NOR circuits included in the set reset latch circuit SR120. To the other of the 3-input NOR circuits, the signals S_HFD1 and S_HFD2 outputted when the half a cycle movement is detected are inputted. Note that, the remaining one input of these two 3-input NOR circuits is connected to an output node of a 3-input NOR circuit that is different from itself.

This SR 120, when an 'H' level of the S_UH or the S_DH is inputted, outputs an 'H' level and latches the same, and when an 'H' level of the S_HFD1 or the S_HFD2 is inputted, outputs an 'L' level and latches the same. The output of the SR120 is inverted by an inverter circuit IV121 and transmitted to a node N4. This node N4 is connected to one input node in four NAND circuits ND120 to ND123.

Each of the ND120 to the ND123, when the N4 is an 'H' level (that is, when an 'H' level of the S_HFD1 or the S_HFD2 is inputted), outputs a signal of the other input node, and when the N4 is an 'L' level (that is, when an 'H' level of the S_UH or the S_DH is inputted), outputs an 'H' level. To the other input node of the ND120, the ND121, the ND122 and the ND123, the digital control signal S_DG, the inverted signal of the S_DG, the S_RH and the S_FH are inputted respectively. And, output signals of the ND120 to the ND123 become the inverted data inputs of the FF120 to the FF123, respectively.

By use of such a configuration, when the signal of the node N4 is an 'H' level, the charge pump circuit CP is controlled by the control signals S_UL, S_DL, S_UH and S_DH, and when the signal N4 is an 'L' level, since the control signals are fixed to an 'L' level and the control of the CP stops. When the N4 is an 'H' level, if any of the signals S_RH and S_FH from the frequency comparison circuit FD[1] becomes an 'H' level, one of the control signals S_UH and S_DH becomes an 'H' level for one cycle accordingly, and the N4 becomes an 'L' level via the SR120. Thereafter, until the phase displaces nearly half a cycle, the N4 remains in an 'L' level, and also the control signals S_UL, S_DL, S_UH and S_DH remains in an 'L' level.

When the phase displaces nearly half a cycle, any of the signals S_HFD1, S_HFDS2 of the frequency comparison circuit FD[2] transits to an 'H' level, and the N4 transits to an 'H' level, too. Thereafter, unless any of the signals S_RH, S_FH of the frequency comparison circuit FD[1] transits to an 'H' level again, the N4 remains in an 'H' level. And, while the N4 is in an 'H' level, always at every cycle, on the basis of the digital control signal S_DG from the phase comparison circuit PD, one of the control signal S_UL to increase the frequency slightly and the control signal S_DL to decrease the frequency slightly transits to an 'H' level. When any of the signals S_RH, S_FH of the frequency comparison circuit FD[1] transits to an 'H' level, the N4 transits to an 'L' level again, and the operation mentioned above is repeated.

Thereby, in a case where the frequencies of the CLK_FB and the CLKB_REF are close, when the frequency comparison results are detected continuously, since only the first one is used for the control, a result to be a true erroneous detection is not used for the control. And, in a case where the frequency comparison results are detected continuously because the frequencies of the CLK_FB and the CLKB_REF are different largely, since the signals S_HFD1 and S_HFD2 detecting that the phase displaces half a cycle are detected continuously, the node N4 returns to an 'H' level soon and the charge pump circuit CP is controlled nearly continuously. That is, it is distinguished from a case of erroneous detection and correct control is performed.

And, when any of the signals S_HFD1, S_HFD2 of the FD[2] transits to an 'H' level, that is, when the phases of the inverted signal of the CLK_FB and the CLKB_REF are nearly identical, the phases of the CLK_FB and the CLK_REF to be inputs of the phase comparison circuit PD are nearly identical. Therefore, if the control based on the phase comparison result is started from this time point, the control is performed in a state in which phases are nearly identical and from a state in which the phase in the higher oscillation frequency side progresses nearly always, and therefore, it is possible to nearly avoid the control based on the phase comparison result from becoming opposite control. Therefore, in both of the control based on the frequency comparison result (to increase or decrease largely) and the control based on the phase comparison result (increase or decrease slightly), the opposite control can be nearly avoided.

On the other hand, in the configuration example in FIG. 7 shown in the first embodiment, in order to avoid the opposite control based on the phase comparison result, the counter circuit count is provided, and a configuration in which the control based on the phase comparison result is stopped for some cycles after the frequency comparison result is outputted is employed. However, in this configuration, there is a possibility that the opposite control based on the phase comparison result occurs slightly. Further, as for the frequency comparison result, in the configuration example in FIG. 7, although the convergence time can be reduced since the control is performed using continuous plural correct (and correct as a result) comparison results, the reverse control may occur slightly depending on the number of shift stages of the judgment circuit JGE. Accordingly, in the sense that the reverse control is reduced extremely, the method of the second embodiment is useful.

As mentioned above, by use of the semiconductor integrated circuit device according to the second embodiment, unnecessary frequency control along with erroneous detection of the frequency comparison circuit can be suppressed, and the time for convergence of the frequency control in the PLL circuit can be shortened. And, since the opposite control based on the phase comparison result can be nearly avoided, the time for convergence of the frequency control in the PLL circuit can be shortened. Furthermore, since the control step of the charge amount of the charge pump circuit can be reduced, a PLL circuit with high precision or small jitter can be realized.

Note that, in FIG. 10, a configuration in which the FD[1] performs the frequency comparison and the FD[2] detects the half a cycle movement is employed, however, reversely, a configuration in which the FD[1] detects the half a cycle movement and the FD[2] perform the frequency comparison can be employed. In this case, at a time point when the FD[1] outputs the signals S_HFD1 and S_HFD2, the phase of the input signal to the phase comparison circuit PD is in a position moved for half a cycle, and a time point when the FD[2] outputs the signals S_RH and S_FH is a time point where the phases of the input signals to the PD are nearly identical. Accordingly, in order to perform the phase comparison at an appropriate time point, in the charge pump control circuit CP_CTL2 in FIG. 12, change to reverse the inputs of the ND120 and the ND121 in the node N4 side is made. Note that, in this case, under some design conditions, the operation may become unstable slightly in comparison with the case of using FIG. 10 and FIG. 12 as they are.

Third Embodiment

Figure 13:
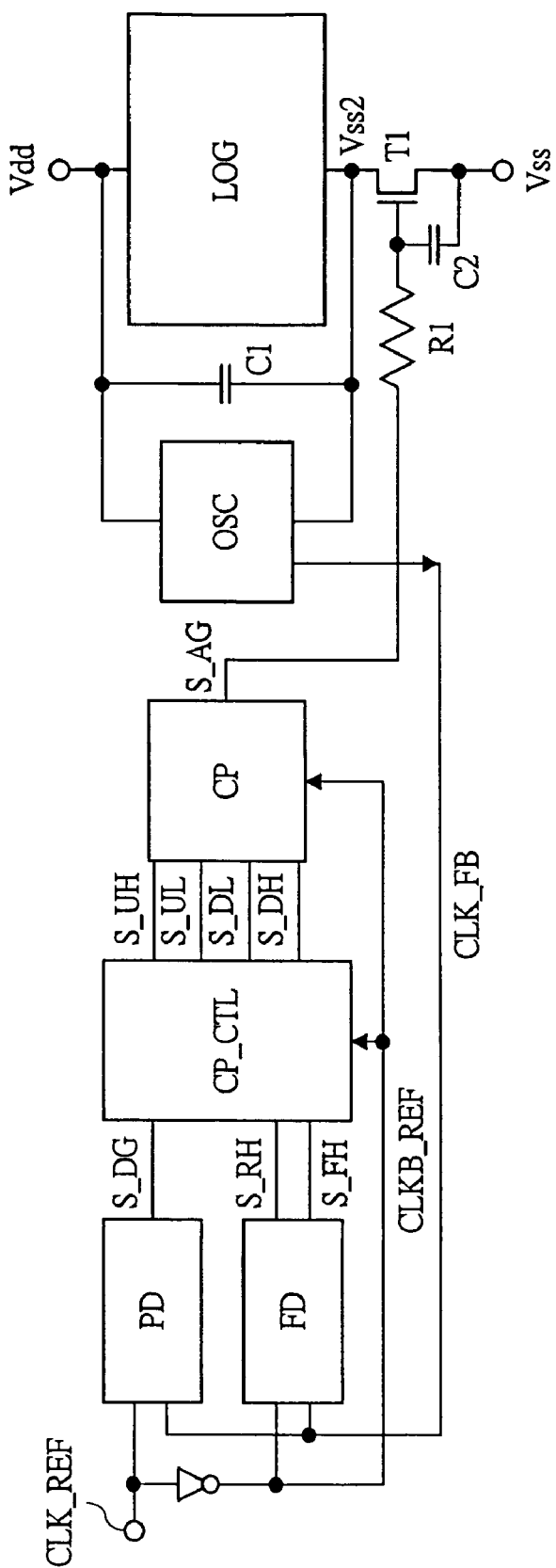
FIG. 13 is a block diagram showing an example of a configuration of a semiconductor integrated circuit device according to a third embodiment of the present invention.

In the first and second embodiments described above, the PLL circuit is explained as the semiconductor integrated circuit device. In a third embodiment, an example of a semiconductor integrated circuit device having a function to control delay time of a logic circuit utilizing the frequency control method mentioned in the first embodiment is shown. FIG. 13 is a block diagram showing an example of a configuration of a semiconductor integrated circuit device according to the third embodiment.

The semiconductor integrated circuit device shown in FIG. 13 is formed over one semiconductor chip, for example, and comprises a phase comparison circuit PD, a frequency comparison circuit FD, a charge pump control circuit CP_CTL, a charge pump circuit CP, a ring oscillator circuit OSC, a logic circuit LOG, capacitances C1 and C2, a resistor R1, an NMOS transistor T1 and the like. The PD, the FD, the CP_CTL and the CP have the configurations in FIG. 4, FIG. 5, FIG. 7 and FIG. 9 respectively, in the same manner as in the first embodiment.

The logic circuit LOG comprises a desired logic function, and is connected to the power source voltage (power source voltage node) Vdd and the second ground voltage (second ground voltage node). Between this Vdd and the Vss2, the ring oscillator circuit OSC is further connected. This OSC comprises odd number stages of inverter circuits like the oscillator circuit OSC included in the voltage controlled oscillation circuit VCO in FIG. 3, for example, and performs oscillation at a frequency according to potential difference between the Vdd and the Vss2. Accordingly, as described in Patent Document 3, by controlling the potential difference between the Vdd and the Vss2 so that the oscillation frequency of the OSC becomes constant, the delay time of the logic circuit LOG can be kept constant. Further, by controlling magnitude itself of the oscillation frequency of the OSC, magnitude itself of the delay time of the logic circuit LOG can be controlled.

The capacitance C1 is connected between the Vdd and the Vss2, and in the same manner as the capacitance C1 included in FIG. 2 and FIG. 3, has a function to stabilize the power source voltage. The NMOS transistor T1 is provided between the Vss2 and the first ground voltage (first ground voltage node), and to a gate thereof, the analog control signal S_AG from the CP is inputted via a low pass filter consisting of a resistor R1 inserted in series and capacitance C2 inserted in parallel.

Accordingly, if the potential difference between the Vdd and the Vss2 is controlled by this S_AG, the OSC oscillates at a frequency corresponding to the potential difference. An oscillation signal from the OSC is fed back as the feedback signal CLK_FB, and inputted to the phase comparison circuit PD and the frequency comparison circuit FD. The PD and the FD, in the same manner as in the first embodiment, for example, compare the reference signal CLK_REF inputted from outside (and an inverted signal CLKB_REF thereof) and the CLK_FB and output the digital control signal S_DG and the signals S_RH and S_FH as a comparison result to the charge pump control circuit CP_CTL. The CP_CTL, in response to these signals, outputs the control signals S_UH, S_UL, S_DL and S_DH to the charge pump circuit CP, and from the CP, the analog control signal S_AG is outputted again.

As described above, if the semiconductor integrated circuit device according to the third embodiment is used, as explained in the first embodiment, the unnecessary frequency control operation along with erroneous detection of the frequency comparison circuit FD can be suppressed and therefore, the oscillation frequency of the OSC can converge in short time. Accordingly, the delay time of the logic circuit LOG can reach a steady state (that is, a target value) faster in comparison with the case of Patent Document 3. And, the circuit scale can be smaller in comparison with the case of Patent Document 3. Further, since the charge pump circuit CP in FIG. 13 has the control step of the charge amount of high-precision (high-resolution) as explained in FIG. 8A to FIG. 9, the delay time of the logic circuit LOG can be adjusted further precisely in comparison with the case of Patent Document 3.

Note that, in the semiconductor integrated circuit device in FIG. 13, the method in which the frequencies of the reference signal CLK_REF and the feedback signal CLK_FB are compared directly is used, however, of course, a configuration in which one or both of them is frequency-divided and the frequencies thereof are set to be identical can be employed.

Fourth Embodiment

Figure 14:
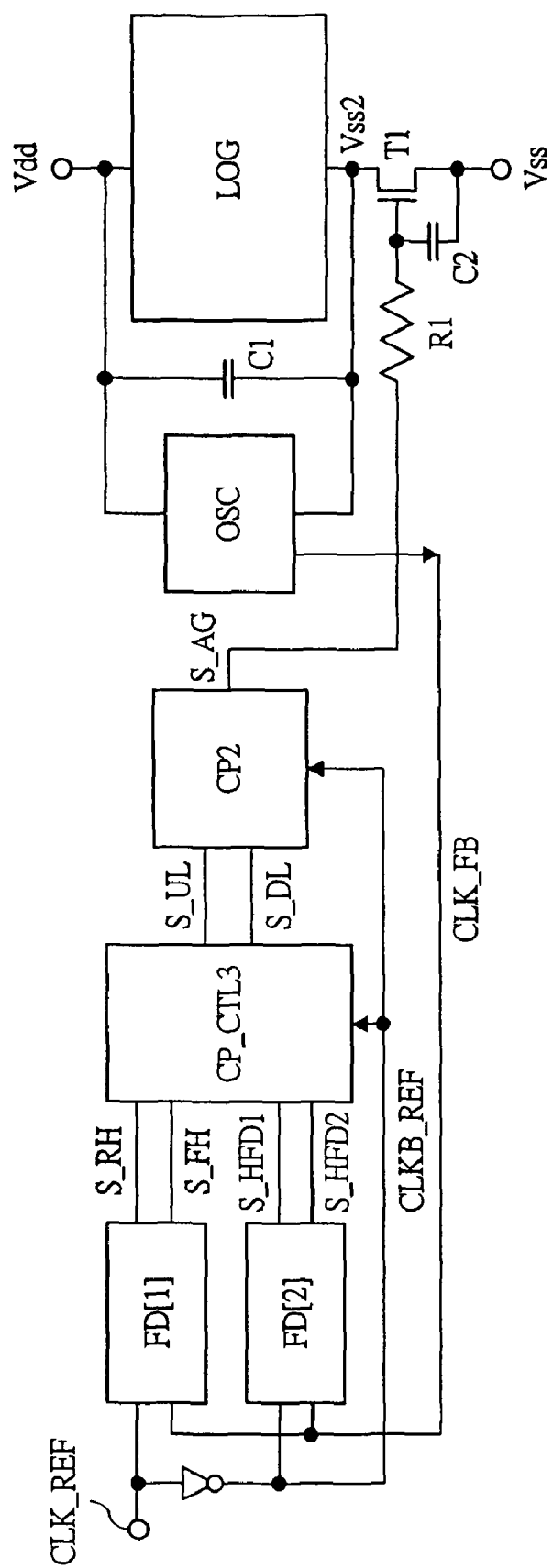
FIG. 14 is a block diagram showing an example of a configuration of a semiconductor integrated circuit device according to a fourth embodiment of the present invention.

In a semiconductor integrated circuit device according to a fourth embodiment, different from the third embodiment mentioned above, the delay time of the logic circuit is controlled using the frequency control method mentioned in the second embodiment. FIG. 14 is a block diagram showing an example of a configuration of the semiconductor integrated circuit device according to the fourth embodiment.

In the semiconductor integrated circuit device shown in FIG. 14, different from the semiconductor integrated circuit device shown in FIG. 13, a phase comparison circuit is not provided, and the frequency comparison is carried out using two frequency comparison circuits FD[1] and FD[2]. The charge pump circuit CP2 is controlled using a result of the comparison via the charge pump control circuit CP_CTL3. Note that, a configuration in which the power source voltage of the ring oscillator circuit OSC and the logic circuit LOG is controlled by the analog control signal S_AG obtained as an output of this CP2 and feedback is carried out from the OSC is the same as that in FIG. 13.

The frequency comparison circuits FD[1] and FD[2] have the configuration in FIG. 5 respectively, in the same manner as that in the second embodiment. The FD[1] outputs signals S_RH and S_FH showing which of the frequencies of the reference signal CLK_REF and the feedback signal CLK_FB from OSC is higher, and the FD[2] outputs signals S_HFD1 and S_HFD2 showing that the CLK_REF and the CLK_FB move half a cycle.

Figure 15:
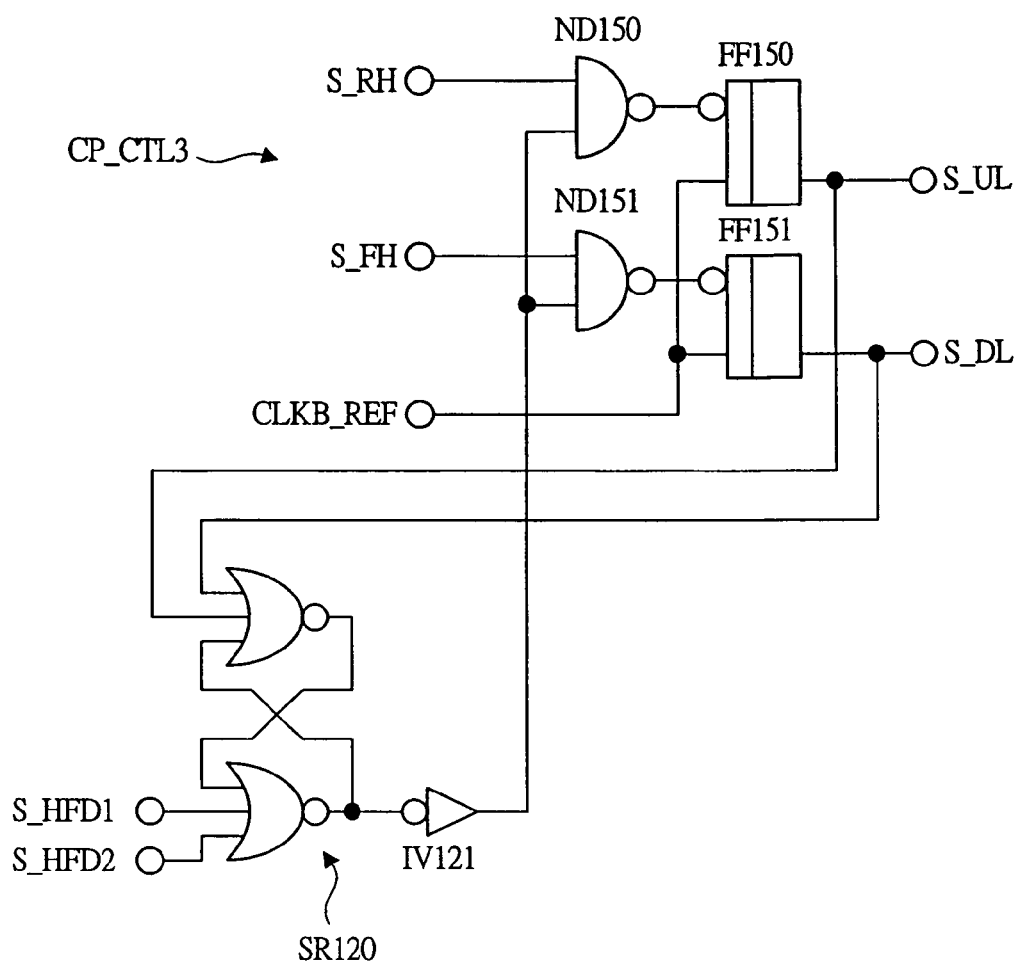
FIG. 15 is a circuit diagram showing a configuration example of a charge pump control circuit in the semiconductor integrated circuit device in FIG. 14.

FIG. 15 is a circuit diagram showing a configuration example of the charge pump control circuit in the semiconductor integrated circuit device in FIG. 14. The charge pump control circuit CP_CTL3 shown in FIG. 15 has a configuration obtained by omitting circuits operating in response to the phase comparison result (that is, the IV120, the ND120, the ND121, the FF120 and the FF121) from the charge pump control circuit CP_CTL2 shown in FIG. 12 of the second embodiment. The other configurations are the same as those in FIG. 12, and in addition to NAND circuits ND150 and ND151 corresponding to the ND122 and the ND123 in FIG. 12 and flip-flop circuits FF150 and FF151 corresponding to the FF122 and the FF123 in FIG. 12, the set reset latch circuit SR120 and the inverter circuit IV121 are provided. Note that, different from the case of FIG. 12, from the FF150 and the FF151 of the CP_CTL3, the control signal S_UL and the control signal S_DL for controlling the frequency slightly are outputted based on the signal S_RH and the signal S_FH. This is for performing highly precise control based on the frequency comparison result without using the phase comparison result.

The charge pump circuit CP2 receives the control signals S_UL and S_DL and outputs the analog control signal S_AG. Although not illustrated, a configuration thereof can be obtained by omitting circuits operating in response to the control signals S_UH and S_DH (the ND93, the Tp93 and the Tn93) from the configuration in FIG. 9, for example.

As mentioned above, by use of the semiconductor integrated circuit device according to the fourth embodiment, in the same manner as in the third embodiment, the delay time of the logic circuit LOG can reach a steady state (that is, a target value) faster in comparison with the case of Patent Document 3. Further, in comparison with the case of Patent Document 3, the circuit scale can be smaller. And, the delay time of the logic circuit LOG can be adjusted more precisely than that of the case of Patent Document 3.

Fifth Embodiment

In the third embodiment mentioned above, the delay time of the logic circuit is controlled by controlling the power source voltage using the frequency control method according to the first embodiment. In a semiconductor integrated circuit device according to a fifth embodiment, the delay time of the logic circuit is controlled by controlling a substrate bias of an LSI using the frequency control method according to the first embodiment. If the substrate bias of the LSI is controlled, characteristics of a MOS transistor and the like change as described in Patent Document 4, for example, and thereby the delay time of the logic circuit can be controlled.

Figure 16:
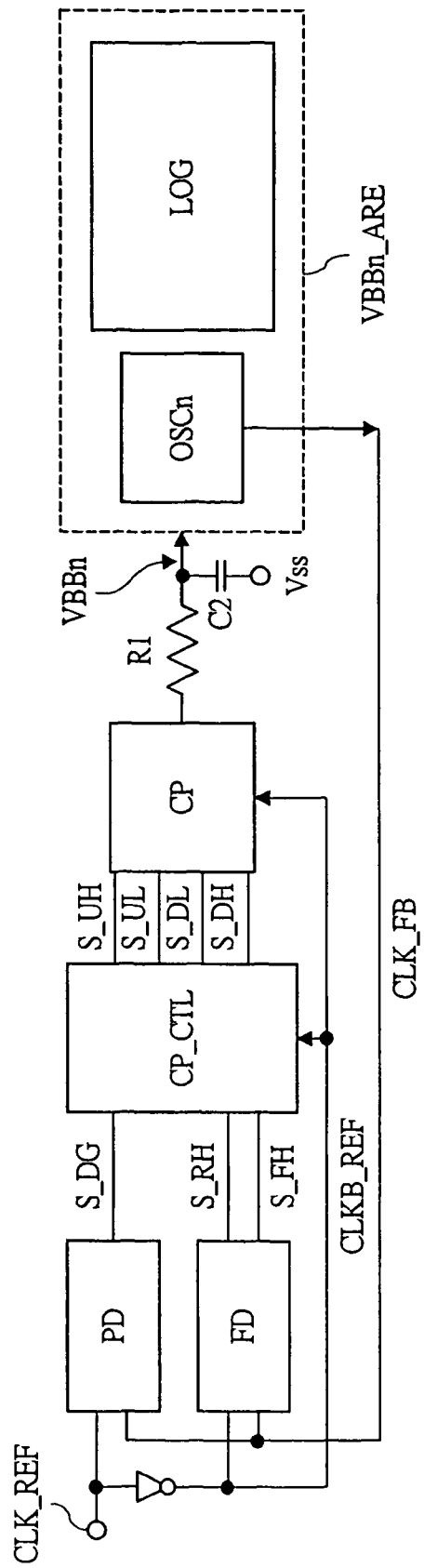
FIG. 16 is a block diagram showing an example of a configuration of a semiconductor integrated circuit device according to a fifth embodiment of the present invention.

FIG. 16 is a block diagram showing an example of a configuration of a semiconductor integrated circuit device according to a fifth embodiment of the present invention. The semiconductor integrated circuit device shown in FIG. 16 is formed, for example, over one semiconductor chip, and is composed of a phase comparison circuit PD, a frequency comparison circuit FD, a charge pump control circuit CP_CTL, a charge pump circuit CP, a low pass filter consisting of a resistor R1 and capacitance C2, a ring oscillator circuit OSCn, a logic circuit LOG and the like.

The PD, the FD, the CP_CTL and the CP have the configurations in FIG. 4, FIG. 5, FIG. 7 and FIG. 9 respectively, in the same manner as in the case of the first or the third embodiment mentioned above, and operate in the same manner as in the first or the third embodiment. That is, the PD and the FD compare the reference signal CLK_REF inputted from outside (and its inverted signal CLKB_REF) and the feedback signal CLK_FB fed back from the OSCn for example, and output the digital control signal S_DG and the signals S_RH and S_FH as the comparison result to the charge pump control circuit CP_CTL. In response to these signals, the CP_CTL outputs the control signals S_UH, S_UL, S_DL and S_DH to the charge pump circuit CP. The CP outputs a substrate bias voltage VBBn via the low pass filter consisting of the resistor R1 inserted in series and capacitance C2 inserted in parallel between the Vss and the R1. Here, a configuration ahead of this substrate bias voltage VBBn is different from that in the first or third embodiment.

The substrate bias voltage VBBn is supplied to a semiconductor area VBBn_ARE formed on a semiconductor substrate. This semiconductor area VBBn_ARE is a P-type area for example, and on this P-type area, NMOS transistors included in the ring oscillator circuit OSCn and the logic circuit LOG having a desired logic function are formed. That is, this P-type area may be so-called a P-type substrate including impurities so that the whole semiconductor substrate becomes weak P-type or may be so-called a P-well including impurities so that a certain area thereof becomes P-type and the peripheral thereof becomes N-type or an insulation body.

Figure 17:
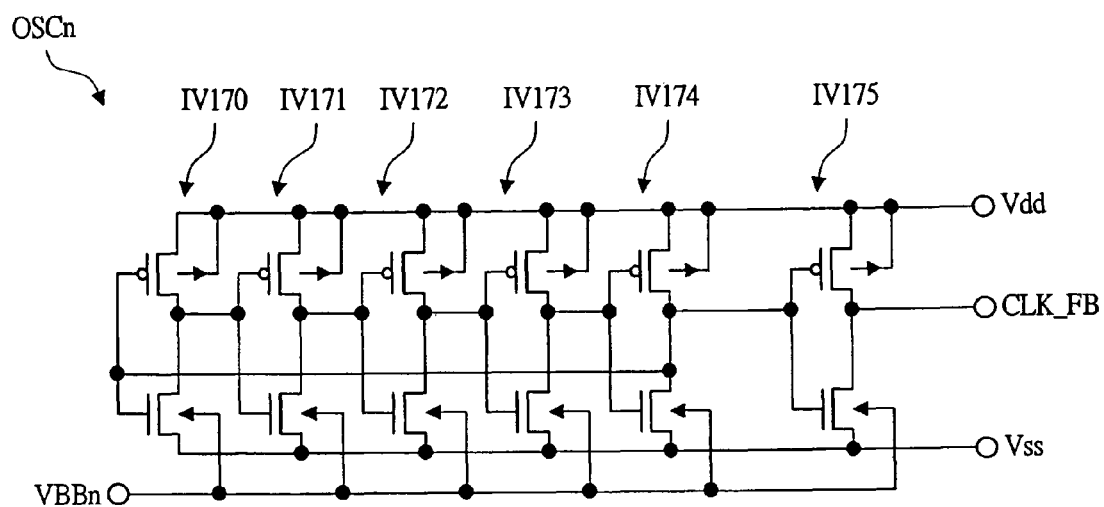
FIG. 17 is a circuit diagram showing a configuration example of a ring oscillator circuit OSC in the semiconductor integrated circuit device in FIG. 16.

FIG. 17 is a circuit diagram showing a configuration example of the ring oscillator circuit OSCn in the semiconductor integrated circuit device in FIG. 16. The ring oscillator circuit OSCn shown in FIG. 17 is, for example, composed of CMOS inverter circuits IV170 to IV174 of odd number stages (herein 5 stages) cascade-connected between the power source voltage node Vdd and the ground voltage node Vss, and a CMOS inverter circuit IV175 connected between the Vdd and the Vss and using an output of IV174 as an input. The IV170 to the IV174 have a ring-shaped configuration in which the output of the IV174 as a last stage is fed back to an input of the IV170 as a first stage, so that oscillation operation is performed. An oscillation signal from the IV174 is fed back as the feedback signal CLK_FB via the IV175.

Here, to substrate potential of the NMOS transistors included in the respective CMOS inverter circuits IV170 to IV175, the substrate bias voltage VBBn is supplied. By using the configuration example in FIG. 16, this substrate bias voltage VBBn is controlled so that the feedback signal CLK_FB from the OSCn and the reference signal CLK_REF become identical. Since this VBBn is also supplied to the NMOS transistors in the logic circuit LOG, characteristics of NMOS transistors in the LOG can be controlled in the same manner as the NMOS transistors in the OSCn, as a result, the delay time of the logic circuit LOG can be controlled.

Figure 18:
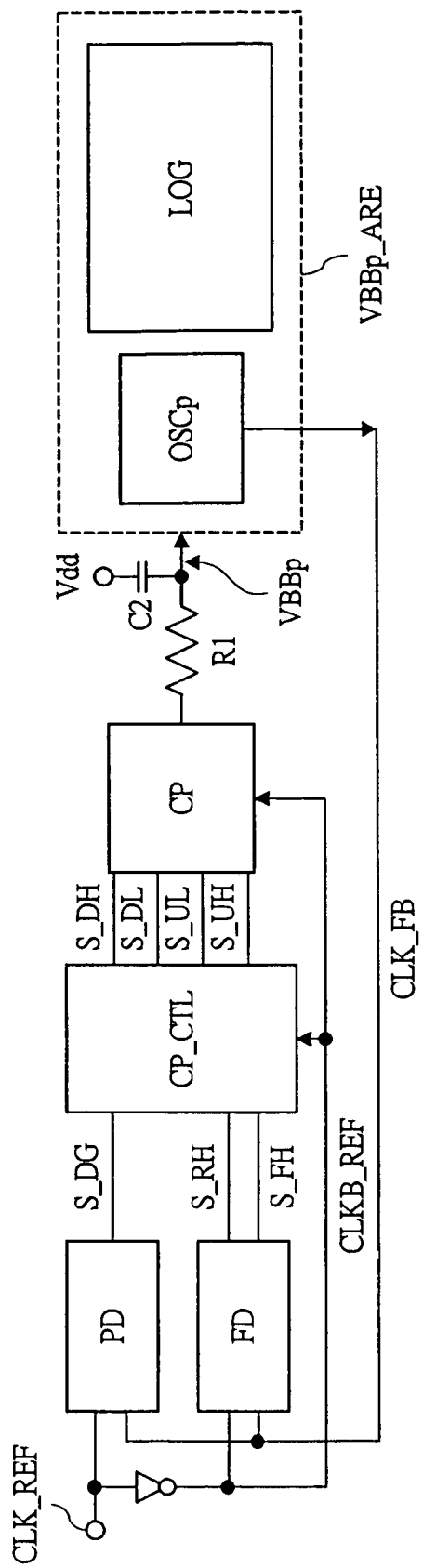
FIG. 18 is a circuit diagram showing a modified configuration example of FIG. 16.

FIG. 18 is a circuit diagram showing a modified configuration example of FIG. 16. Different from the case in FIG. 16, a semiconductor integrated circuit device shown in FIG. 18 is a configuration example in which substrate potential in PMOS transistor side is controlled. In this configuration, a configuration ahead of the low pass filter is different from FIG. 16, and the charge pump circuit CP outputs a substrate bias voltage VBBp via a low pass filter consisting of a resistor R1 inserted in series and capacitance C2 inserted in parallel. The VBBp is supplied to a semiconductor area (herein an N-type area) VBBp_ARE, and in this VBBp_ARE, PMOS transistors included in the ring oscillator circuit OSCp and the logic circuit LOG are formed.

Figure 19:
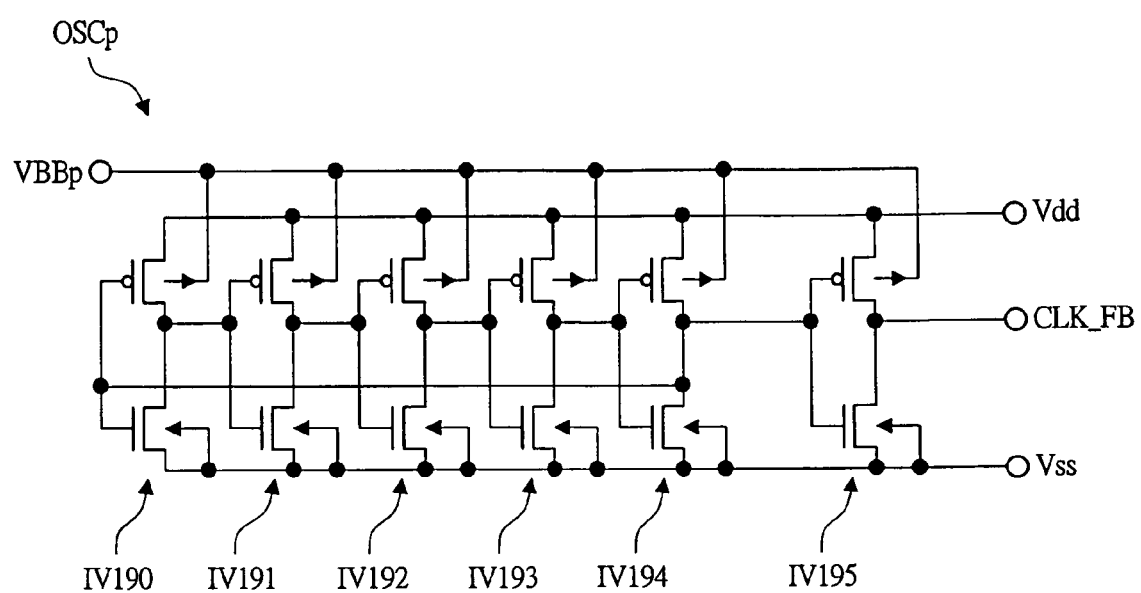
FIG. 19 is a circuit diagram showing a configuration example of a ring oscillator circuit OSC in the semiconductor integrated circuit device in FIG. 18.

FIG. 19 is a circuit diagram showing a configuration example of the ring oscillator circuit OSCp in the semiconductor integrated circuit device shown in FIG. 18. The ring oscillator circuit OSCp shown in FIG. 19 comprises CMOS inverter circuits IV190 to IV195 in the same manner as the IV170 to the IV175 included in the ring oscillator circuit OSCn in FIG. 17. To substrate potential of PMOS transistors included in the respective CMOS inverter circuits IV190 to IV195, the substrate bias voltage VBBp is supplied. Since this VBBp is controlled so that the feedback signal CLK_FB from OSCP and the reference signal CLK_REF become identical, characteristics of the PMOS transistors in the LOG can be controlled in the same manner as the PMOS transistors in the OSCP, as a result, the delay time of the logic circuit LOG can be controlled.

Note that, in the case of FIG. 18, in comparison with the case of FIG. 16, relation between up/down of the output voltage of the charge pump circuit CP and the oscillation frequency (the delay time of the logic circuit LOG) is reversed, and consequently it is necessary to reverse connection relation of the control signals S_DH, S_DL, S_UL and S_UH inputted to the CP from the case in FIG. 16. And, in FIG. 16 and FIG. 18, values of the power source voltage Vdd and the ground voltage Vss to be one end of the charge pump circuit CP and the capacitance C2 can be changed appropriately according to a control range of target substrate potential.

As mentioned above, by use of the semiconductor integrated circuit device according to the fifth embodiment, in the same manner as explained in the first embodiment, unnecessary frequency control operation along with erroneous detection of the frequency comparison circuit FD can be suppressed and the time for convergence of the oscillation frequency of the OSC can be reduced. Accordingly, the delay time of the logic circuit LOG can reach a steady state (that is, a target value) in short time. Furthermore, since the charge pump circuit CP in FIG. 16 or FIG. 18 comprises the control step of high-precision (high-resolution) charge amount as explained in FIG. 8A to FIG. 9, the delay time of the logic circuit LOG can be adjusted precisely.

Note that, although the configuration example in which the substrate potential of NMOS transistors is controlled is shown in FIG. 16 and the configuration example in which the substrate potential of PMOS transistors is controlled is shown in FIG. 18, they can be combined to use, of course. That is, the configuration example in FIG. 16 and the configuration example in FIG. 18 are provided respectively and the substrate potential of NMOS transistors and the substrate potential of PMOS transistors are controlled respectively. In this case, as for the ring oscillator circuit OSCn in a side of controlling the substrate potential of NMOS transistors, it is preferable that a gate width of a NMOS transistor is designed to be small and a gate width of a PMOS transistor is designed to be large. Thereby, characteristic change of a NMOS transistor is reflected by the oscillation frequency of the OSCn more greatly than that of a PMOS transistor. This is preferable for control of characteristics of NMOS transistors. In the same manner, as for the ring oscillator circuit OSCp in a side of controlling the substrate potential of PMOS transistors, it is preferable that a gate width of PMOS transistor is designed to be small and a gate width of NMOS transistor is designed to be large. Thereby, characteristic change of a PMOS transistor is reflected by the oscillation frequency of the OSCP more greatly than that of a NMOS transistor. This is preferable for control of characteristics of PMOS transistors.

Sixth Embodiment

Figure 20:
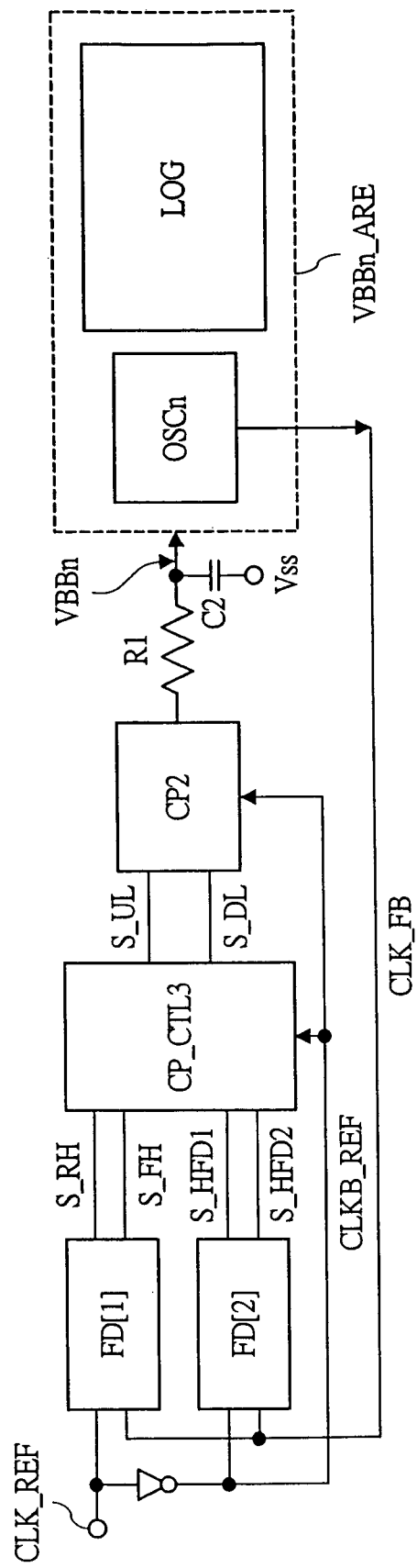
FIG. 20 is a block diagram showing an example of a configuration of a semiconductor integrated circuit device according to a sixth embodiment of the present invention.

A semiconductor integrated circuit device according to a sixth embodiment, different from the fifth embodiment mentioned above, the delay time of the logic circuit is controlled by controlling a substrate bias of an LSI using the frequency control method mentioned in the second embodiment. FIG. 20 is a block diagram showing an example of a configuration of the semiconductor integrated circuit device according to the sixth embodiment.

In the semiconductor integrated circuit device shown in FIG. 20, different from the semiconductor integrated circuit device shown in FIG. 16, a phase comparison circuit is not provided, and the frequency comparison is carried out using two frequency comparison circuits FD[1] and FD[2]. The charge pump circuit CP2 is controlled using a result of the comparison via the charge pump control circuit CP_CTL3. Note that, a configuration in which the substrate potential of NMOS transistors included in the ring oscillator circuit OSCn and the logic circuit LOG is controlled by an output of this CP2 via the low pass filter is the same as that in FIG. 16.

The frequency comparison circuits FD[1] and FD[2], in the same manner as in the case of the second embodiment, have the configuration shown in FIG. 5, respectively. The FD[1] outputs signals S_RH and S_FH showing which of the frequencies of the reference signal CLK_REF and the feedback signal CLK_FB from the OSCn is higher, and the FD[2] outputs signals S_HFD1 and S_HFD2 showing that the CLK_REF and the CLK_FB move half a cycle. The charge pump control circuit CP_CTL3 comprises the configuration in FIG. 15 shown in the fourth embodiment, receives the signals S_RH, S_FH, S_HFD1 and S_HFD2 and outputs the control signals S_UL and S_DL. The charge pump circuit CP2 also, in the same manner as the charge pump circuit CP2 explained in the fourth embodiment, receives the control signals S_UL and S_DL and supplies a substrate bias voltage VBBn to a semiconductor area (herein a P-type area) via a low pass filter consisting of a resistor R1 and capacitance C2.

As mentioned above, by use of the semiconductor integrated circuit device according to the sixth embodiment, in the same manner as in the case of the fifth embodiment, the delay time of the logic circuit LOG can reach a steady state (that is, a target value) in short time. Furthermore, the delay time of the logic circuit LOG can be adjusted precisely. Note that, here, the configuration example in which the substrate potential in an NMOS transistor side is controlled is shown, but of course, a configuration in which the substrate potential in a PMOS transistor side is controlled in the same manner as that in the fifth embodiment, or a configuration obtained by combining them can be used.

In the foregoing, the invention made by the inventor of the present invention has been concretely described based on the embodiments. However, it is needless to say that the present invention is not limited to the foregoing embodiments and various modifications and alterations can be made within the scope of the present invention.

For example, in the embodiments mentioned above, a MOS transistor is used as a transistor, but of course, this can be replaced with a bipolar transistor or the like. Further, in FIG. 2 and the like, a transistor is provided in a ground voltage side and by gate potential thereof, the control of the oscillation frequency is carried out, but in the same manner, the transistor can be provided in a power source voltage side and by gate potential thereof, the control of the oscillation frequency can be carried out.

The semiconductor integrated circuit device according to the present invention is technique effectively applied in particular to a semiconductor integrated circuit device such as a PLL circuit. And, the present invention is not limited to thereto, and can be applied widely to various semiconductor integrated circuit devices including various feedback systems in which high-speed or high-precision control is required.

What is claimed is:

1. A semiconductor integrated circuit device comprising:

a first frequency comparison circuit having a first signal and a second signal inputted, performing comparison using one of: same edges of both of the first signal and the second signal; and a rising edge of one of the first signal and the second signal and a falling edge of the other one of the first signal and the second signal; as comparison objectives, making judgment that a frequency of the second signal is higher and outputting a first potential level to a second comparison node when a comparison objective edge of the second signal appears at least two times between continuous two comparison objective edges of the first signal, and making judgment that a frequency of the first signal is higher and outputting a first potential level to a first comparison node when an edge of the first signal appears at least two times between continuous two edges of the second signal;

a second frequency comparison circuit having the first signal and the second signal inputted, performing comparison using a rising edge of one of the first signal and the second signal and a falling edge of the other one of the first signal and the second signal as comparison objectives when the first frequency comparison circuit uses same edges of both of the first signal and the second signal as comparison objectives, performing comparison using same edges of both of the first signal and the second signal as comparison objectives when the first frequency comparison circuit uses a rising edge of one of the first signal and the second signal and a falling edge of the other one of the first signal and the second signal as comparison objectives, making judgment that a frequency of the second signal is higher and outputting a first potential level to a fourth comparison node when a comparison objective edge of the second signal appears at least two times between continuous two comparison objective edges of the first signal and making judgment that a frequency of the first signal is higher and outputting a first potential level to a third comparison node when an edge of the first signal appears at least two times between continuous two edges of the second signal;

a first control circuit transmitting only a first potential level of one of the first comparison node and the second comparison node outputted first after outputting of a first potential level to one of the third comparison node and the fourth comparison node in every time when the first potential level is outputted to one of the third comparison node and the fourth comparison node; and a second control circuit performing a desired processing according to a first potential level of one of the first comparison node and the second comparison node transmitted by the first control circuit, and wherein each of the first frequency comparison circuit and the second frequency comparison circuit comprises:

a set reset latch circuit latching a second potential level to a first node and a third potential level to a second node according to one of the first signal and a signal obtained by inverting the first signal and latching a third potential level to the first node and a second potential level to the second node according to one of the second signal and a signal obtained by inverting the second signal;

a first flip-flop circuit outputting one of a first potential level and a fourth potential level to one of the first comparison node and the third comparison node by taking in a potential level of the first node using one of the first signal and a signal obtained by inverting the first signal as a clock trigger; and a second flip-flop circuit outputting one of a first potential level and a fourth potential level to one of the second comparison node and the fourth comparison node by taking in a potential level of the second node using one of the second signal and a signal obtained by inverting the second signal as a clock trigger, wherein the first control circuit transits to an active state when a first potential level is outputted to one of the third comparison node and the fourth comparison node, transmits potential levels of the first comparison node and the second comparison node to a first control node and a second control node during the active state and transits to an inactive state when a first potential level is transmitted to one of the first control node and the second control node, and wherein the second control circuit performs a desired processing according to potential levels of the first control node and the second control node.

* * * * *